United States Patent
Wells et al.

(10) Patent No.: US 9,208,265 B2
(45) Date of Patent: Dec. 8, 2015

(54) SYSTEM AND METHOD FOR JEWELRY DESIGN

(71) Applicant: Jostens, Inc., Minneapolis, MN (US)

(72) Inventors: Richard David Wells, St. Louis Park, MN (US); Michael J. Ross, St. Paul, MN (US); John Freiberg, New Brighton, MN (US); Paul Joseph Rysavy, Burnsville, MN (US); Eric J. Loring, Prior Lake, MN (US); Karmin L. Stanley, Montgomery, MN (US)

(73) Assignee: Jostens, Inc., Minneapolis, MN (US)

( * ) Notice: Subject to any disclaimer, the term of this patent is extended or adjusted under 35 U.S.C. 154(b) by 506 days.

(21) Appl. No.: 13/690,714

(22) Filed: Nov. 30, 2012

(65) Prior Publication Data

US 2013/0173040 A1 Jul. 4, 2013

Related U.S. Application Data

(60) Provisional application No. 61/566,392, filed on Dec. 2, 2011.

(51) Int. Cl.
*G06F 17/50* (2006.01)

(52) U.S. Cl.
CPC ............ *G06F 17/5009* (2013.01); *G06F 17/50* (2013.01)

(58) Field of Classification Search
CPC ............................. G06F 17/50; G06F 17/5009
See application file for complete search history.

(56) References Cited

U.S. PATENT DOCUMENTS

| | | | |
|---|---|---|---|
| 2,858,897 A | 11/1958 | Kraemer | |
| 3,910,066 A | 10/1975 | Strack | |
| 3,964,915 A | 6/1976 | Doenges et al. | |
| 4,004,333 A | 1/1977 | Daniels | |
| 4,561,061 A | 12/1985 | Sakamoto et al. | |
| 4,630,309 A | 12/1986 | Karow | |
| 4,761,865 A * | 8/1988 | Magnien et al. | 29/10 |
| 4,771,474 A | 9/1988 | Takashima et al. | |

(Continued)

FOREIGN PATENT DOCUMENTS

| | | |
|---|---|---|
| FR | 2536969 | 6/1984 |
| FR | 2829366 | 3/2003 |

(Continued)

OTHER PUBLICATIONS

Park, Sang C. "Polygonal extrusion", The Visual Computer, Jan. 28, 2003, Springer-Verlag, pp. 38-49.

(Continued)

*Primary Examiner* — Ramesh Patel
(74) *Attorney, Agent, or Firm* — Winthrop & Weinstine, P.A.

(57) ABSTRACT

A system for designing a customized ring may include a ring style selection component, a ring top design component, a ring side design component, and an image panel component where, the components support an interface for monitoring the progress of the ring design and an image panel may show an image of the ring that is periodically updated based on customization input. A system for creating and displaying ring assets may include an extraction component, a rendering component, and a display component. A system for displaying customized bezel text may include a text mapping module configured to receive bezel parameters, map text in a two dimensional space, map text in a three-dimensional space defined by bezel geometry, develop code for displaying the text, and displaying the text.

20 Claims, 35 Drawing Sheets

(56) References Cited

U.S. PATENT DOCUMENTS

| | | | |
|---|---|---|---|
| 4,796,442 A | 1/1989 | Sarcona | |
| 4,918,611 A | 4/1990 | Shyu et al. | |
| 4,969,201 A | 11/1990 | Takasaki et al. | |
| 4,972,323 A | 11/1990 | Cauwet | |
| 5,003,498 A | 3/1991 | Ota et al. | |
| 5,007,098 A | 4/1991 | Kumagai | |
| 5,116,174 A | 5/1992 | Fried et al. | |
| 5,249,670 A | 10/1993 | Simon | |
| 5,261,768 A | 11/1993 | Loucks et al. | |
| 5,329,381 A | 7/1994 | Payne | |
| 5,369,736 A | 11/1994 | Kato et al. | |
| 5,377,506 A | 1/1995 | Tranzer | |
| 5,473,742 A | 12/1995 | Polyakov et al. | |
| 5,532,933 A | 7/1996 | Nakata | |
| 5,544,291 A | 8/1996 | Gilley et al. | |
| 5,548,698 A | 8/1996 | Smith et al. | |
| 5,569,003 A | 10/1996 | Goldman et al. | |
| 5,587,913 A | 12/1996 | Abrams et al. | |
| 5,588,310 A | 12/1996 | Lai | |
| 5,649,079 A | 7/1997 | Holmes | |
| 5,668,930 A | 9/1997 | Hamura et al. | |
| 5,689,577 A | 11/1997 | Arata | |
| 5,739,822 A | 4/1998 | Paradine | |
| 5,739,912 A | 4/1998 | Ishii | |
| 5,790,713 A | 8/1998 | Kamada et al. | |
| 5,850,222 A | 12/1998 | Cone | |
| 5,926,388 A | 7/1999 | Kimbrough et al. | |
| 5,926,389 A | 7/1999 | Trounson | |
| 5,968,564 A | 10/1999 | Welsh et al. | |
| 5,977,007 A | 11/1999 | Lassow et al. | |
| 6,003,228 A | 12/1999 | Riggio | |
| 6,083,267 A * | 7/2000 | Motomiya et al. | 703/6 |
| 6,085,126 A | 7/2000 | Mellgren, III et al. | |
| 6,101,280 A | 8/2000 | Reynolds | |
| 6,124,858 A | 9/2000 | Ge et al. | |
| 6,138,055 A | 10/2000 | Pryor | |
| 6,181,839 B1 | 1/2001 | Kannon et al. | |
| 6,249,289 B1 | 6/2001 | Arnaud et al. | |
| 6,260,383 B1 | 7/2001 | Warren et al. | |
| 6,300,595 B1 | 10/2001 | Williams | |
| 6,349,758 B1 | 2/2002 | Bell | |
| 6,407,361 B1 | 6/2002 | Williams | |
| 6,434,277 B1 | 8/2002 | Yamada et al. | |
| 6,546,305 B1 * | 4/2003 | Hruby | 700/117 |
| 6,568,455 B2 | 5/2003 | Zieverink | |
| 6,600,488 B1 | 7/2003 | Moreton et al. | |
| 6,628,279 B1 | 9/2003 | Schell et al. | |
| 6,763,279 B2 | 7/2004 | Davis | |
| 6,856,314 B2 | 2/2005 | Ng | |
| 6,877,916 B2 | 4/2005 | Khaikin | |
| 6,978,230 B1 | 12/2005 | Klosowski et al. | |
| 6,982,710 B2 | 1/2006 | Salomie | |
| 7,003,371 B2 | 2/2006 | Tsuchida et al. | |
| 7,006,089 B2 | 2/2006 | Baumberg | |
| 7,069,108 B2 | 6/2006 | Saarela et al. | |
| 7,091,963 B2 | 8/2006 | Dresevic et al. | |
| 7,236,180 B2 | 6/2007 | Dresevic et al. | |
| 7,593,786 B2 | 9/2009 | Saarela et al. | |
| 7,747,055 B1 | 6/2010 | Vinig et al. | |
| D625,216 S | 10/2010 | Morgan | |
| 7,856,285 B2 | 12/2010 | Carbonera et al. | |
| D639,108 S | 6/2011 | Molayem | |
| 8,085,266 B2 | 12/2011 | Carbonera et al. | |
| 8,126,683 B2 | 2/2012 | Carbonera et al. | |
| D684,880 S | 6/2013 | Matysik | |
| 8,473,088 B2 * | 6/2013 | Carbonera et al. | 700/117 |
| 8,515,826 B2 * | 8/2013 | Norman | 705/26.5 |
| RE44,696 E * | 1/2014 | Saarela et al. | 700/193 |
| D734,976 S | 7/2015 | Quinn | |
| 2001/0044668 A1 | 11/2001 | Kimbrough et al. | |
| 2002/0049648 A1 | 4/2002 | Inoue et al. | |
| 2002/0063912 A1 | 5/2002 | Barbanell | |
| 2002/0085748 A1 | 7/2002 | Baumberg | |
| 2002/0092322 A1 * | 7/2002 | Zieverink | 63/33 |
| 2002/0113865 A1 | 8/2002 | Yano et al. | |
| 2002/0128742 A1 | 9/2002 | Zieverink | |
| 2002/0154122 A1 * | 10/2002 | Di Lelle | 345/467 |
| 2002/0159638 A1 | 10/2002 | Ratner et al. | |
| 2002/0181802 A1 | 12/2002 | Peterson | |
| 2002/0191863 A1 | 12/2002 | Biermann et al. | |
| 2004/0020241 A1 | 2/2004 | Boiadjian | |
| 2004/0091143 A1 | 5/2004 | Hu | |
| 2004/0111178 A1 * | 6/2004 | Saarela et al. | 700/193 |
| 2004/0237822 A1 | 12/2004 | Boland et al. | |
| 2005/0086134 A1 | 4/2005 | Bar et al. | |
| 2005/0089237 A1 | 4/2005 | Park et al. | |
| 2005/0147312 A1 | 7/2005 | Chen | |
| 2005/0149409 A1 | 7/2005 | Whaley | |
| 2005/0160574 A1 | 7/2005 | Bazin et al. | |
| 2005/0171866 A1 * | 8/2005 | Herbert et al. | 705/27 |
| 2005/0222862 A1 * | 10/2005 | Guhde et al. | 705/1 |
| 2006/0001664 A1 | 1/2006 | Carbonera | |
| 2006/0096731 A1 | 5/2006 | Do et al. | |
| 2006/0200269 A1 | 9/2006 | Saarela et al. | |
| 2006/0217037 A1 | 9/2006 | Kalanovic | |
| 2006/0224462 A1 | 10/2006 | Brezenoff | |
| 2006/0290695 A1 | 12/2006 | Salomie | |
| 2007/0250456 A1 | 10/2007 | Braunwart | |
| 2008/0040080 A1 | 2/2008 | Bae et al. | |
| 2008/0177410 A1 * | 7/2008 | Carbonera | 700/98 |
| 2008/0229784 A1 * | 9/2008 | Carbonera et al. | 63/28 |
| 2009/0056373 A1 | 3/2009 | Czajka et al. | |
| 2009/0060393 A1 | 3/2009 | Satoh | |
| 2009/0110307 A1 | 4/2009 | Markowitz | |
| 2009/0127138 A1 | 5/2009 | Allameh | |
| 2009/0263624 A1 | 10/2009 | Illston | |
| 2010/0152873 A1 | 6/2010 | Dunne et al. | |
| 2010/0169059 A1 * | 7/2010 | Thomas-Lepore et al. | 703/1 |
| 2010/0274610 A1 | 10/2010 | Andersen et al. | |
| 2010/0323154 A1 | 12/2010 | Sharobiem | |
| 2011/0144785 A1 | 6/2011 | Carbonera et al. | |
| 2011/0145100 A1 | 6/2011 | Berger et al. | |
| 2011/0213482 A1 * | 9/2011 | Saarela et al. | 700/98 |
| 2011/0282476 A1 | 11/2011 | Hegemier et al. | |
| 2011/0307349 A1 | 12/2011 | Gandhi et al. | |
| 2011/0313878 A1 * | 12/2011 | Norman | 705/26.5 |
| 2012/0075297 A1 | 3/2012 | Carbonera et al. | |
| 2012/0116729 A1 | 5/2012 | Carbonera et al. | |
| 2012/0168024 A1 | 7/2012 | Beck et al. | |
| 2012/0234044 A1 | 9/2012 | Matysik | |
| 2013/0085792 A1 * | 4/2013 | Klein | 705/7.14 |
| 2013/0204736 A1 | 8/2013 | Klein | |
| 2013/0218714 A1 * | 8/2013 | Watkins et al. | 705/26.7 |
| 2013/0326457 A1 * | 12/2013 | MacMunn et al. | 716/122 |
| 2014/0052563 A1 | 2/2014 | Watkins et al. | |
| 2014/0075988 A1 | 3/2014 | Matysik | |
| 2015/0026015 A1 | 1/2015 | Fishman et al. | |
| 2015/0055085 A1 | 2/2015 | Fonte et al. | |
| 2015/0055086 A1 | 2/2015 | Fonte et al. | |

FOREIGN PATENT DOCUMENTS

| | | |
|---|---|---|
| FR | 2880521 | 7/2006 |
| JP | 2003150666 | 5/2003 |
| WO | 0057254 | 8/2000 |
| WO | 0193156 | 12/2001 |
| WO | 2004053653 | 6/2004 |

OTHER PUBLICATIONS

Stam, Jos et al. "Quad/Triangle Subdivision", Computer Graphics Forum, vol. 22, No. 1, Apr. 2003, pp. 79-85.

"2004 Your Guide to feature-based Manufacturing", Jun. 2003, Engineering Geometry Systems, Tenth Edition, pp. 13-66, 153-182, 291-298, 311-342, 369, 380, 441-457.

Patent Abstracts of Japan, vol. 2003, No. 9, Sep. 3, 2003.

International Search Report for PCT Application No. PCT/US2005/013469, mailed Sep. 6, 2005.

Sigmund et al. "Transformations between Pictures from 2D to 3D", Jun. 2000, Journal of Intelligent and Robotic Systems, vol. 28, pp. 69-84.

(56) References Cited

OTHER PUBLICATIONS

Hendricks, Bob. "Henricks Mfg. Jewellers-CNC Production of Wax Models Boosts Ring Sales by 50%", www.techno-isel.com/CNC_Routers/Testimonials/Articles/Hendricks.htm, Nov. 25, 2001.

Wick et al. "Tool and Manufacturing Engineers Handbook", 1998, Society of Manufacturing Engineers, vol. 3, Chapter 15, pp. 15-1, 15-2, and 15-25.

Wirth, Joachim "Rapid Modeling", Carl Hanser Verlag, Munchen, 2002, pp. 60-62, 170-177.

International Search Report and Written Opinion. International Patent Application No. PCT/US2008/056705. Mailed Apr. 8, 2008.

Techjewel, "TechGems 3.0", User Guide, 2004.

Stamati et al. "A Parametric Feature-based CAD System for Reproducing Traditional Pierced Jewellery", Computer-Aided Design, vol. 37, Issue 4, pp. 431-449, Apr. 2005.

Wannarumon et al. "Intelligent Computer System for Jewelry Design Support", Computer Aided Design and Applications, 1 (1-4) 551-558, 2004.

Rowan, Mark, "Automated Methods for Evolutionary Pave Jewellery Design", The University of Birmingham School of Computer Science, Jan. 15, 2006.

Delcam plc, "ArtCAM JewelSmith User Gu de", Issue 7.1 Sep. 11, 2004.

Wannarumon et al. "Rapid Prototyping and Tooling Technology in Jewelry CAD", Computer-Aided Design and Applications, Jan. 2004, vol. 1, No. 1-4 (pp. 569-575).

\* cited by examiner

Fig. 27

SYSTEM AND METHOD FOR JEWELRY DESIGN

CROSS REFERENCE TO RELATED APPLICATION

This application claims priority to U.S. Provisional Application No. 61/566,392 filed Dec. 2, 2011 entitled SYSTEM AND METHOD FOR JEWELRY DESIGN, the contents of which are hereby incorporated by reference herein in their entirety.

FIELD OF THE INVENTION

The present invention relates generally to a method and system for designing jewelry, such as rings, class rings, championship rings or other jewelry that may be customizable or personalizable. More specifically, this invention relates to an online system and method for designing custom rings, in which an image of the custom ring is automatically provided to the user and updated as the user makes changes to the design of the custom ring.

BACKGROUND

Personalized rings, such as class rings, are popular. Class rings in particular have been popular keepsakes among students for generations. Today, personalized rings have expanded to include such items as affiliation rings, which may commemorate membership in certain organizations, and championship rings, which may commemorate victories in sports or other competitions.

Historically, class rings were relatively uniform and provided students little opportunity to express themselves through individualized, personal features. This was, at least in part, because manufacturing involved hand carving of molds and mass production of like looking rings was more economical. Over time, however, automated manufacturing processes have made it possible to provide students or other purchasers of keepsake rings with an opportunity to customize their choices. Such customization may permit ring purchasers to specify such features as the style and color of a stone, the specific graphics or crest to appear on the ring, and the text to appear on the ring. Still other customization and personalization may also be accommodated.

Selecting desirable custom features for a keepsake ring can be difficult for users if they are unable to see an image of the ring incorporating the features that they have chosen. In particular, students or others who are designing customized or personalized rings may not have designed a ring before or they may have little experience designing rings and, as such, may have difficulty visualizing the result of one or several customizing selections.

SUMMARY

In one embodiment, a system for designing a customized ring may include a computing device having computer implemented instructions stored thereon for receiving and storing ring customization input. The instructions may include a ring style selection component for receiving ring customization input defining the ring style. The instructions may also include a ring top design component for receiving ring customization input defining the ring top design. The instructions may also include a ring side design component for receiving ring customization input defining the ring side design. The instructions may also include an image panel component. The components may support an interface for monitoring the progress of the ring customization input and the interface may have a ring image panel controlled by the image panel component. The image panel may show an image of the ring and the image may be periodically updated based on the ring customization input to show the customized ring.

In another embodiment, a system for creating and displaying ring assets for use in designing a customized ring may be provided. The system may include a computing device having computer implemented instructions stored thereon for creating ring assets. The instructions may include an extraction component for extracting relevant data from a computer aided drafting file. The instructions may also include a rendering component for creating a rendered image based on the data. The instructions may also include a display component for displaying the rendered image.

In still another embodiment, a system for displaying customized bezel text of a customized ring may be provided. The system may include a computing device having computer implemented instructions stored thereon for receiving and storing custom bezel text input. The instructions may include a text mapping module configured for performing a plurality of dynamic operations. The dynamic operations may include receiving bezel parameters, mapping the text in a two dimensional space, mapping the text in a three-dimensional space defined by bezel geometry, developing code for displaying the text on a screen, and displaying the text on a screen.

In another embodiment, a system for customizing rings may include a computer including a display and an input device. The system may also include a computer program capable of presenting a graphical user interface to an operator. The graphical user interface may enable the operator to customize a ring by selecting a ring style to customize from among provided ring styles, select from provided options for features of the ring, and save the customized ring incorporating the features the operator selected. The system may also include a computer program capable of displaying on the computer display an image of the customized ring incorporating the features the operator selects.

In another embodiment, a system for customizing rings may include a computer including a display and an input device. The system may also include a computer program capable of presenting a graphical user interface to an operator, such graphical user interface enabling the operator to customize a ring by performing at least one of, creating an event, selecting a ring style to customize from among provided ring styles, authorizing other operators to participate in customizing the ring, selecting from provided options for features of the ring, requesting custom features for the ring, and saving the customized ring incorporating the features the operator selected. The system may also include a computer program capable of displaying on the computer display an image of the customized ring incorporating the features the operator selects.

Accordingly, the system may provide a "what you see is what you get" design tool allowing the user the visualize the ring or other jewelry item that they have created and providing the user with confidence in his/her design leading to a higher level of satisfaction in the purchase of rings. While multiple embodiments are disclosed, still other embodiments of the present teachings will become apparent to those skilled in the art from the following detailed description, which shows and describes illustrative embodiments. As will be realized, the teachings are capable of modifications in various aspects, all without departing from the spirit and scope of the present teachings. Accordingly, the drawings and detailed description are to be regarded as illustrative in nature and not restrictive.

BRIEF DESCRIPTION OF THE DRAWINGS

FIG. 27 illustrates an order form creation page permitting entry of information to customize an order form for customized rings in accordance with one embodiment of the present invention.

DETAILED DESCRIPTION

The present invention relates to a system and method for designing and customizing keepsake rings, such as class rings, championship rings, and affiliation rings. In use, the ring design system permits users, such as sales representatives, to design and customize keepsake rings for purchase by customers, and/or further to select and specify features that will be available for selection by the customers themselves when they customize their rings. In some embodiments, the system facilitates contributions to the design of the rings and selection of available features by other users, such as school representatives and customers. The system further permits customers to view and select from available customization options, and automatically generates an image of the keepsake ring incorporating the customized features selected by the customer for viewing by the customer. Further, the system permits users such as sales representatives to generate customized advertisements, order forms, or invitations to order customizable keepsake rings. Also, in some embodiments, the system permits users to describe features that are not pre-selected and available for incorporation into the customizable keepsake rings. In such cases, the system permits the user to request the creation of artwork according to the customer's description.

Of course, in addition permitting the design and customization of keepsake rings, the present invention may be used to permit the design and customization of other jewelry or keepsake items, such as pendants. Generally, the present invention may be applied to the design and customization of any keepsake or jewelry item with customizable features. Thus, while the present invention is generally described in terms of keepsake rings, the invention is equally suited for other items.

Figure 1A:
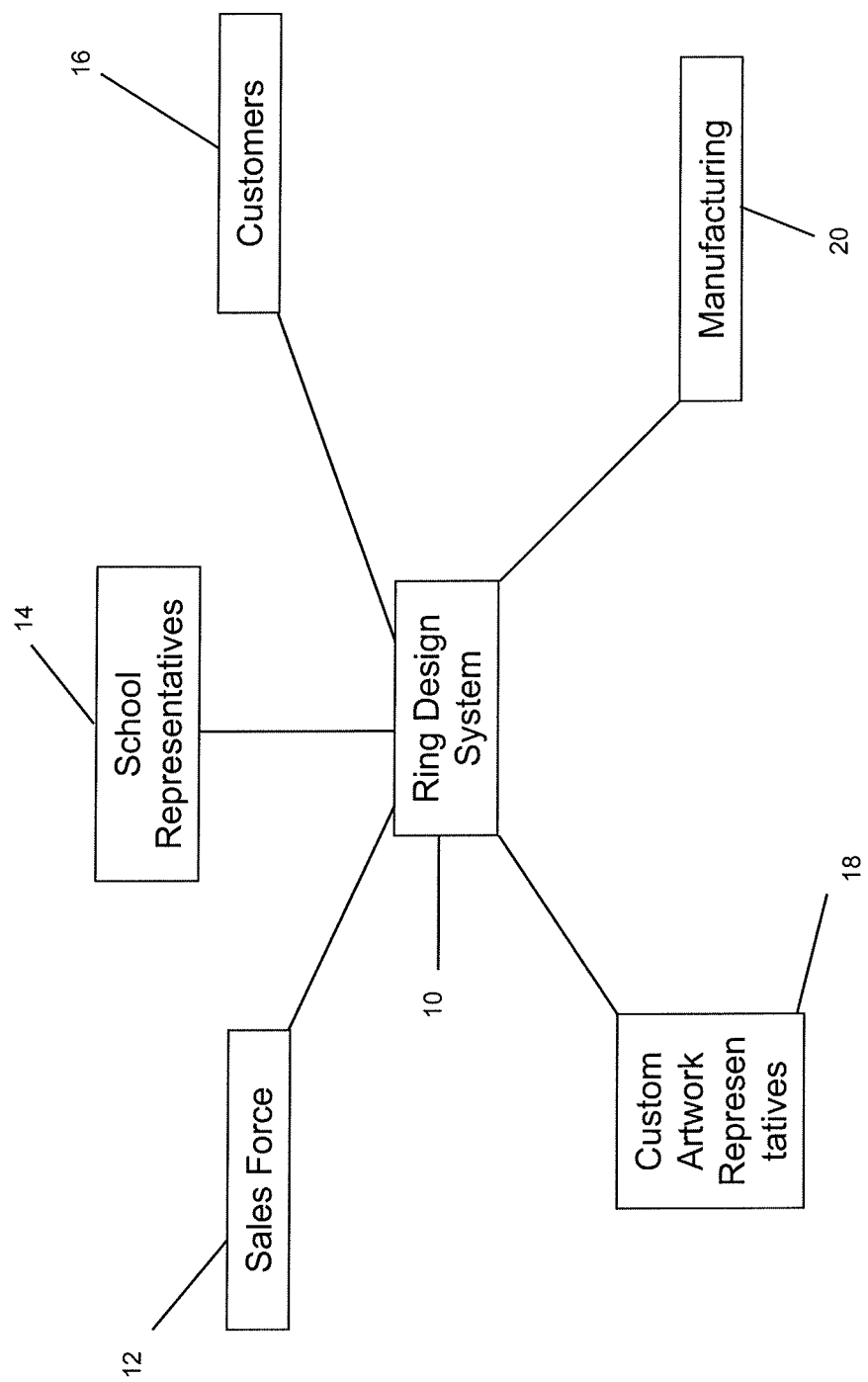
FIG. 1A illustrates interaction of a ring design system in accordance with one embodiment of the present invention.

As shown in FIG. 1A, the ring design system 10 may interact with a sales force 12, school or other organization representatives 14, customers (e.g., students, athletes, coaches, organization heads or owners, parents, fans, etc.) 16, custom artwork representatives 18, and production 20. The sales force 12 may design rings or portions thereof and/or select options that may be made available to customers. The sales force may also create advertisements, order forms, and invitations directed toward representatives and/or customers to design and order custom rings. Representatives 14 may also participate in the design of rings, and may order rings for customer groups. Customers 16 may participate in the design of rings, and may design and order custom rings. Custom artwork representatives 18 may respond to requests for custom artwork, design such artwork, and add such custom features to the rings designed and ordered by sales force 12, school representatives 14, and customers 16. When the designed rings are completed and ordered, they may be manufactured in production 20.

Figure 1B:
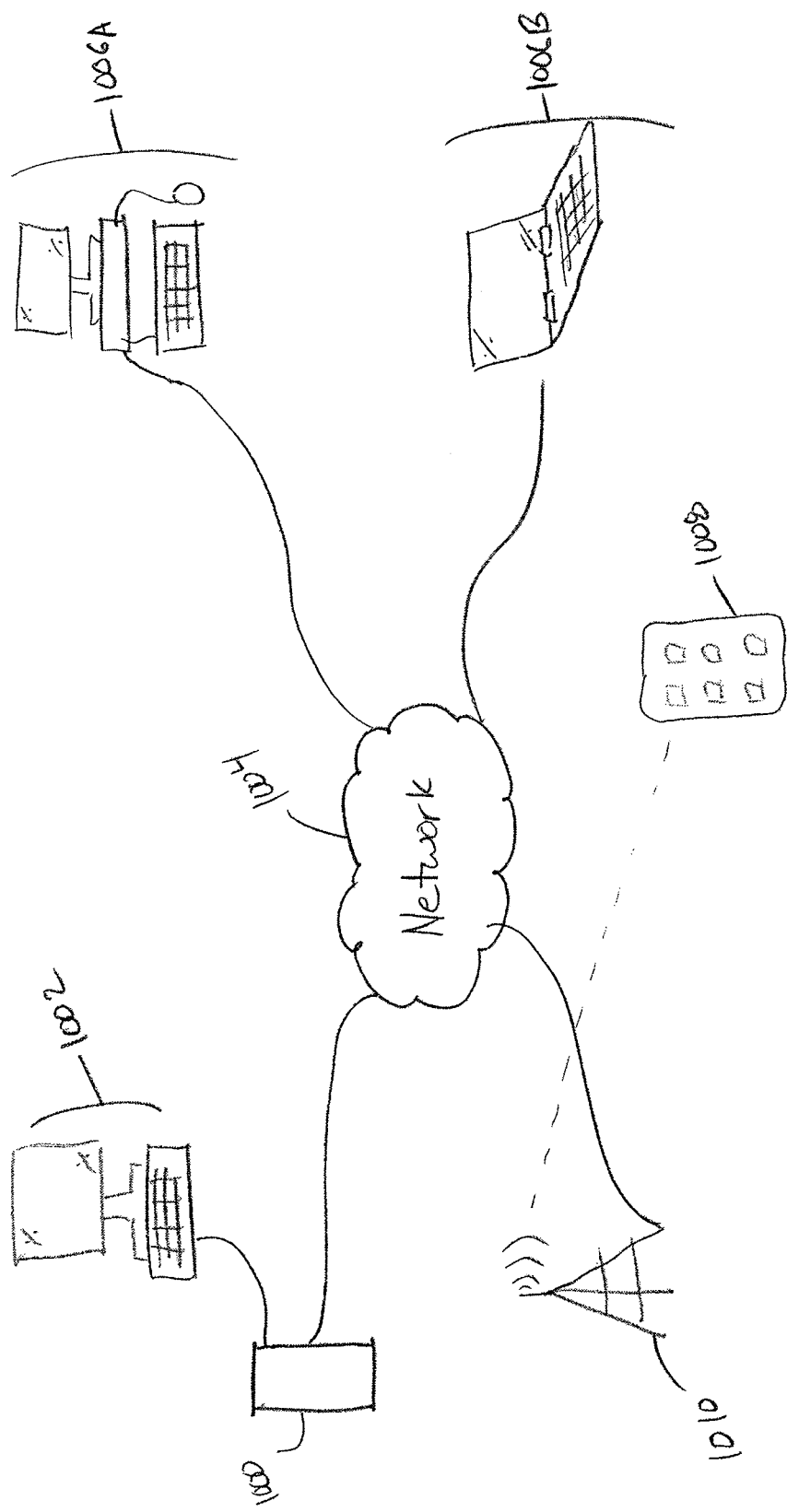
FIG. 1B illustrates a system of devices on which the ring design system, shown in FIG. 1A, may be arranged according to some embodiments of the present invention.

FIG. 1B depicts a computer environment on which the ring design system 10 may be arranged and/or may form a part of. The system 10 may be adapted such that access to the system is available from the back end (i.e., owner/administrator of the system 10) as well as from the front end (i.e., by sales force 12, school representatives 14, customers 16, custom artwork representatives 18, and manufacturing 20. The system 10 may include hardware, software or a combination of hardware and software and may be made up of hardware or software components on one or more of the devices shown in FIG. 1B.

The system 10 may, for example, include a server 1000 with a server interface 1002 allowing for back end or front end access to the system 10. The server may be in communication with a network 1004 such as, for example, the Internet. A variety of user interfaces may be available to the system 10 via the network 1004. For example, one or more user work stations 1006 such as a personal computer 1006A, laptop 1006B, or other work stations 1006 may be used to access portions of the system 10 via the network 1004. Remote access to the system may also be provided via a remote device 1008 such as a personal digital assistant, smartphone, or other remote device in communication with an network access point 1010 such as a transmission tower, for example. While several of the connections between the computers, laptops, and other workstations are shown with wired connections, these may be Wi-Fi or other wireless type connections. Still other communication may be provided.

The system 10 may include a plurality of components or modules each including hardware, software, or a combination of hardware and software. As such, the method steps, interfaces, and other functionalities and features of the system 10 described below may be provided in the form of such components or modules. The components or modules may be stored on or be part of hardware arranged on any of the servers, server interfaces, work stations, or remote devices and may be executable in whole or in part by processors on the respective devices or other devices in communication with the device on which the component or module is stored. In one embodiment, the system 10 may include one or more software modules stored in a computer readable storage medium of the server 1000 and access to the system may be via web page interfaces accessible via the network from work stations 1006 or remote devices 1008. In this embodiment, little or none of the system 10 may be stored on the work stations 1006 or remote devices 1008. In other embodiments, some or all of the system 10 may be downloadable and executable from a work station or remote device. Still other arrangements of the components or modules of the system 10 may be provided.

FIGS. 2-7 depict flowcharts of various aspects of the system and method for designing keepsake rings in accordance with one or more embodiments of the invention. While the various steps of these flowcharts are presented and described sequentially, one of ordinary skill in the art will appreciate that some or all of the steps may be executed in different orders or in parallel.

Figure 2:
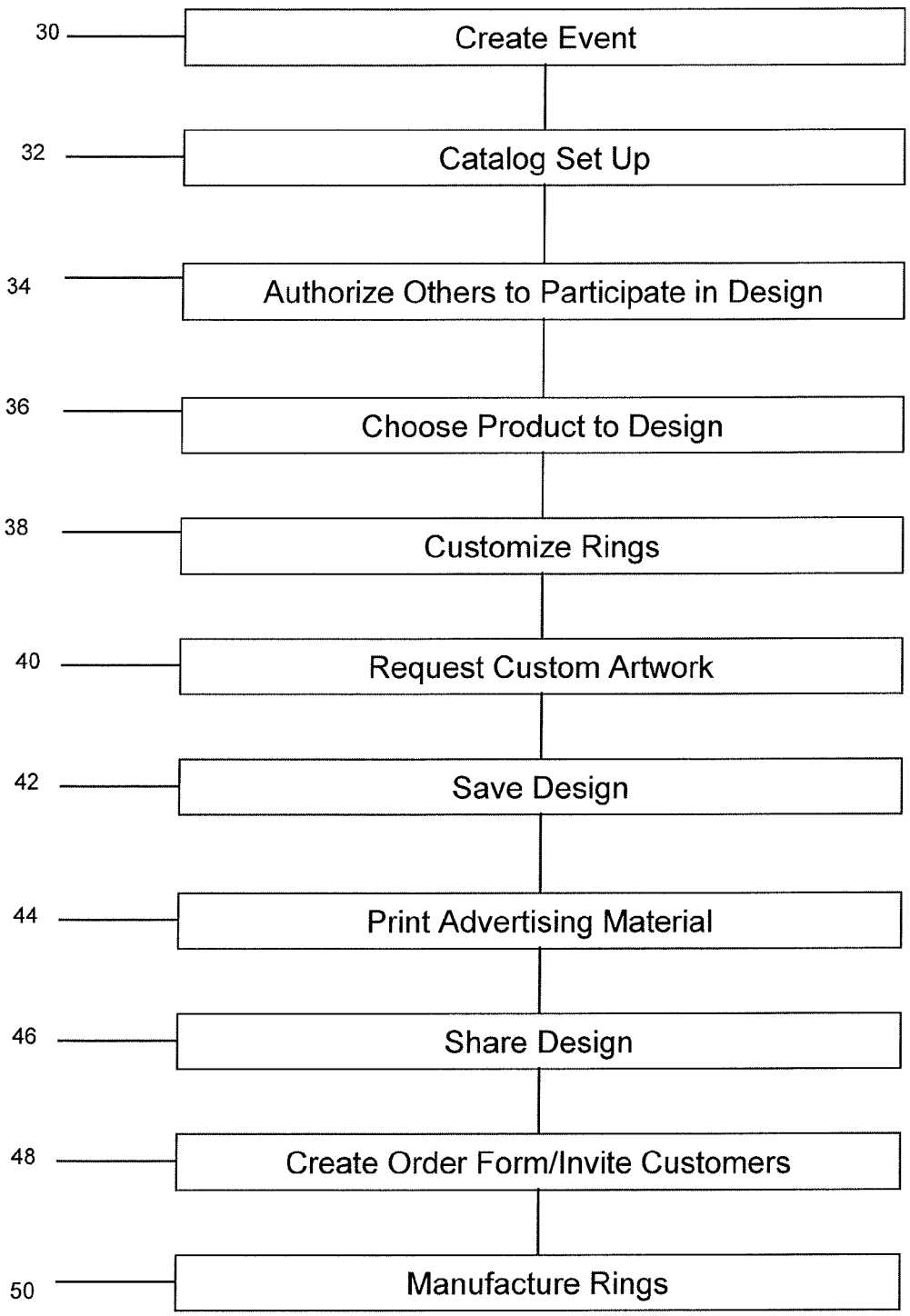
FIG. 2 illustrates a flowchart of a ring design method in accordance with one embodiment of the present invention.

FIG. 2 illustrates a flowchart of one embodiment of a method of designing a ring. Each of the blocks is discussed herein and some of the blocks are shown in more detail in the following figures. For example, the create event block 30 of FIG. 2 may be more fully described with respect to FIG. 3, where additional, more detailed blocks are shown.

With continued reference to FIG. 2, at block 30, a user such as a member of sales force 12 may create an event to which a group of rings may relate. For example, for championship rings, an event may relate to a championship in a high school or college sport or other competition. Typical events of this kind may be "High School Basketball State Championship," "College Football Bowl Game Victory," or "National Moot Court Championship." The events created in block 30 may be anything that may be commemorated by personalized keepsake rings and may relate to a commemorative event involving a group of people.

The user (e.g., the sales force 12 or representative 14) may create a user event at block 30 with a user interface that prompts the user for information relating to the event. The user may input information such as the name of the event and details relating to it, such as the year the event took place, the activity, the award type, and the number and gender of recipients. The user may also select an event categorization, such as high school classification (i.e., class A, class AA, class 6A, etc.) or college division and conference (i.e., Division I, Big Ten, etc.). To facilitate the ordering of rings related to the event, the user may specify an event expiration, which is the period of time during which rings related to the event may be ordered. The user may also specify a price tier for the product, and may provide for the incorporation of cost recovery based on the materials and features pre-selected for the rings included in the event. The user may also specify the options for billing for any ring orders, as well as delivery options. Reference is made to the discussion of FIG. 3 below for more information in this regard.

At block 32, the user (e.g., sales force 12 or representative 14) may set up a catalog for the event via the user interface. That is, the ring design system 10 may be pre-populated with all of the possible styles and sizes of rings available. For example, the available rings may include a range of ring styles for each of small, medium, and large sized rings, for both men and women. At block 32, the user may select those sizes and styles that will be available for selection by customers when they design and customize their own rings. That is, a subset of the available styles, sizes, and other options may be selected as being available for a particular event thereby defining the catalog for that event.

While the user at blocks 30 and 32 may often by the sales force 12, the user may also include a school representative, or other client representative, 14 who may work independently or with the sales force 12 to define the event and the catalog and tailor the event and catalog based on the magnitude or gravity of the event, the desires of the customers 16 with respect to cost and/or customization flexibility, and based on other factors. For example, in some instances, much of customization may be completed by the sales force 12 and/or school or other client representative 14 and little flexibility or customization may be left to customer 16. For example, where there is a desire for several rings to look identical or generally the same, the customization and personalization options available to the customers 16 may be relatively small. In other circumstances, very little may be defined by the sales force 12 and school or other client representative 14, leaving both customization as well as personalization up to the customer 16. A variety of levels of customization and personalization may be available and the level of customization and personalization available to the customers 16 may be initially controlled in the event creation and catalog set up stages 30, 32.

At block 34, the user may optionally authorize and invite others to participate in the design of the rings available for the event created at block 30. Such individuals may include, for example, representatives 14 or customers 16. That is, depending on the level of involvement in the initial stages 30, 32, the representatives 14 may initially be given access at stage 34 as well as customers 14. Where school representatives 14 have already been involved, access may be extended to customers at stage 34, but might not be extended to representatives since access has previously been provided.

At block 36, the user may select the ring product that he or she wishes to customize. The selection may be made from the styles of rings selected and made available at block 32 catalog set up. The user may select the ring style to customize via the user interface. The user in this stage may depend, again, on the nature of the event and the scope of customization and personalization made available in the earlier stages. Where a generally uniform ring design is desired, the user at this stage may be the school, or other client representative, 14. Where more flexibility for the customer 16 is desired or provided, the user here may include the customer 16. Still further, a portion of the customization may be completed by a school, or other client representative, 14 and a remaining portion may be completed by the customer 16.

At block 38, the user (i.e., school representative 14, customer 16, or combination of both) may design and customize the ring. The features that the user may customize may include, for example, the stone type, color, and cut; the crest design and color, the bezel text and text dividers; the side design, color, and text; the metal quality and finish; and any inside engraving. Still other types of customization and/or personalization options may be provided. More detailed descriptions of the customization of the ring are illustrated in FIGS. 4-7 and discussed below.

In the course of designing and customizing a ring, the user may incorporate pre-selected and available features for inclusion in the ring. With respect to certain features, however, the user may opt for a custom feature that is not pre-selected and available in the system. For example, the user may choose to incorporate an outside custom crest or an outside custom design on the ring sides. At box 40, the user may request incorporation of outside custom artwork for inclusion in the ring. To do so, the user may enter into the user interface the location of the outside custom artwork and a description of the outside custom artwork. The system may make the request available to outside custom artwork representatives, who will design the requested outside custom artwork and incorporate it into the customized ring.

At box 42, the user may save the ring design via the user interface. At box 44 the system may permit users such as sales representatives to create and print customized advertising and marketing materials, such as flyers and emails, that optionally provide an image of the ring as designed and customized, as well as text selected or written by the user. At box 46, the user may share the completed design, optionally including an image of the ring as designed and customized, with other individuals, such as potential customers and school representatives, via email or text. At box 48, the system permits users such as sales representatives to create and print or deliver order forms for the rings as designed and customized. The above series of features (boxes 42-48) may be particularly useful in a relatively fixed/low personalization type event for the customers. That is, where, for example, school representatives 14 are designing a state championship ring for a series of athletes, coaches, and assistants, and where much of the customization is completed by such school representatives 14 or by a sales force 12, there may be a desire to provide advertising/marketing materials, to share the design, and provide order forms to customers.

In other embodiments, the system may also permit the user to create an internet experience that shows images of the rings with some preliminary design and/or customization so that customers can view images of the rings, select among further customization and/or personalization options, and order customized rings. In this case, the advertising material 44, sharing 46, and order form 48 feature may still be available and may include images of the preliminarily designed, and may highlight the options remaining for the customer to choose from. In still other embodiments, little to no initial or preliminary design or customization may be provided.

At box 50, the rings that are customized and ordered by customers may be manufactured. In some embodiments, this may involve a rapid prototyping process or an automated engraving process for creating wax models of the rings. The wax models or portions thereof may then be placed through a lost wax process to create the metal rings. The rings may be assembled, polished, and/or otherwise finished, stones may be set in the rings, and the rings may be packaged for shipment to the customers 16.

Figure 3:
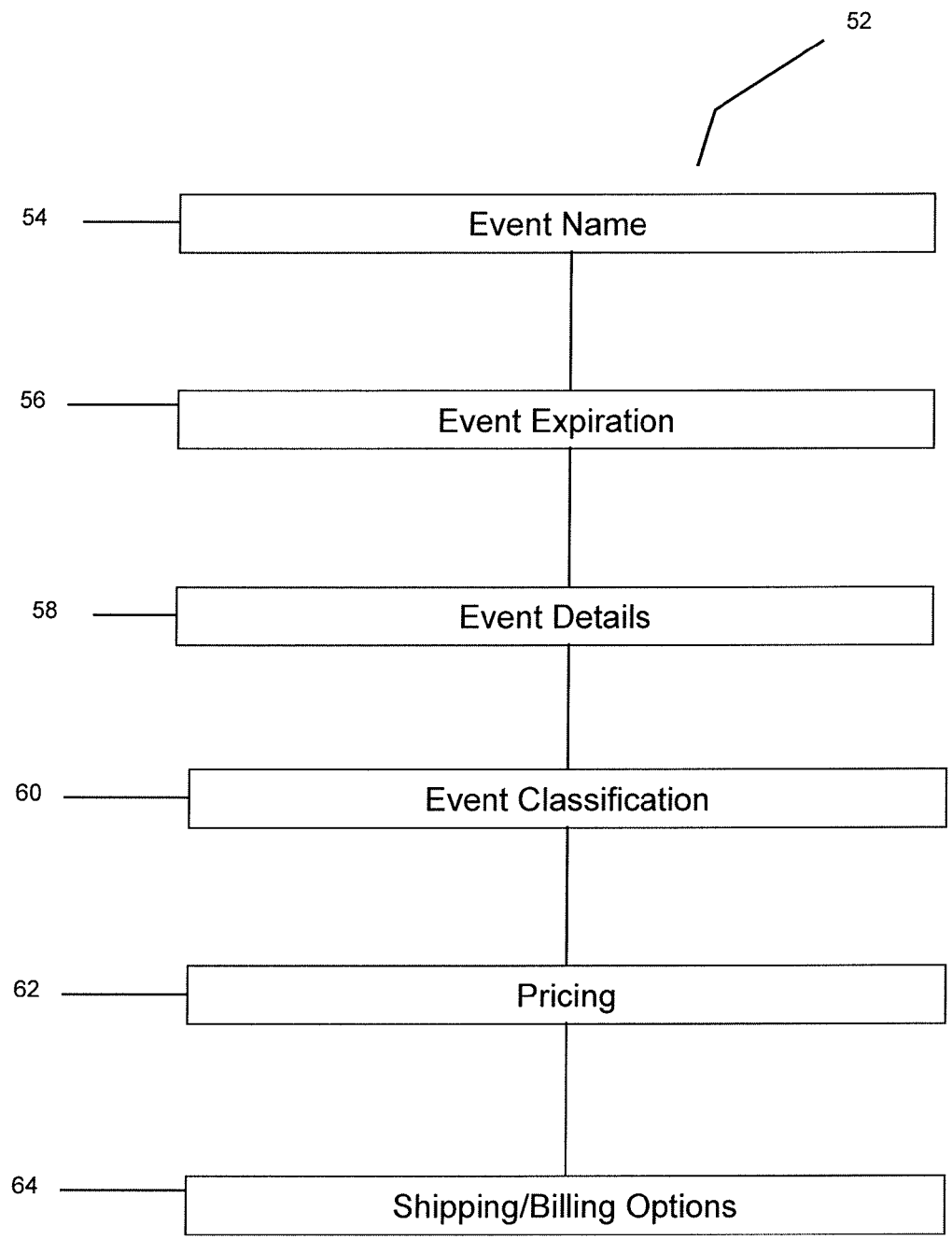
FIG. 3 illustrates a flowchart of a process for creating an event in accordance with one embodiment of the present invention.

FIG. 3 illustrates a flowchart 52 of the create event step of box 30 of FIG. 2. Each of the boxes describes information relating to the event that the user may optionally input via the user interface. At box 54, the user may input the name of the event, such as "High School Basketball State Championship" or "College Football Bowl Game Victory." At box 56, the user may specify an event expiration, i.e., the period during which customers may design, customize, and order rings relating to the event. At box 58, the user may input or select information concerning details of the event, such as the year the event took place, the activity, the award type, and the number and gender of recipients. Box 60 permits the user to select an event categorization, such as high school classification (i.e., class A, class AA, class 6A, etc.) or college division and conference (i.e., Division I, Big Ten, etc.). At box 62, the user may select or input information regarding pricing of the rings for the event, such as price tiers and information that may provide for the incorporation of cost recovery based on the materials and features pre-selected for the rings included in the event. At box 64, the user may specify the options for billing for any ring orders, as well as delivery options. Still other options that identify the event and distinguish the event from other similar events may also be provided.

Figure 4:
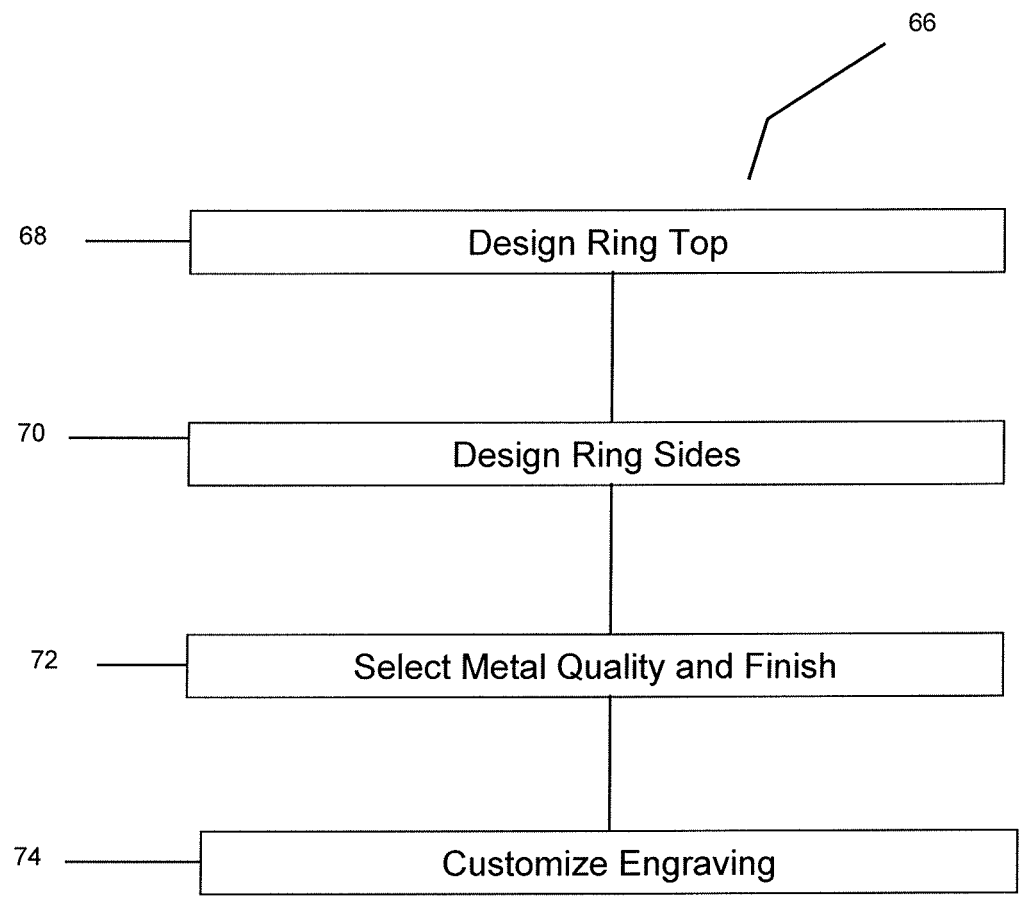
FIG. 4 illustrates a flowchart of a process for customizing the design of a ring in accordance with one embodiment of the present invention.

FIG. 4 illustrates a flowchart 66 of the customize ring step of box 38 of FIG. 2. Each of the boxes describes an aspect of the ring that may be designed and customized. For example, box 68 describes the design and customization of the ring top, box 70 describes the design and customization of the ring sides, box 72 describes the selection of the metal quality and finish for the ring, and box 74 describes the customization of any engraving on the ring. While still other aspects of the ring may be designed and customized and interfaces may be provided therefor, operations 68, 70, and 72 will each be described in more detail in the following FIGS. 5, 6, and 7, respectively.

Figure 5:
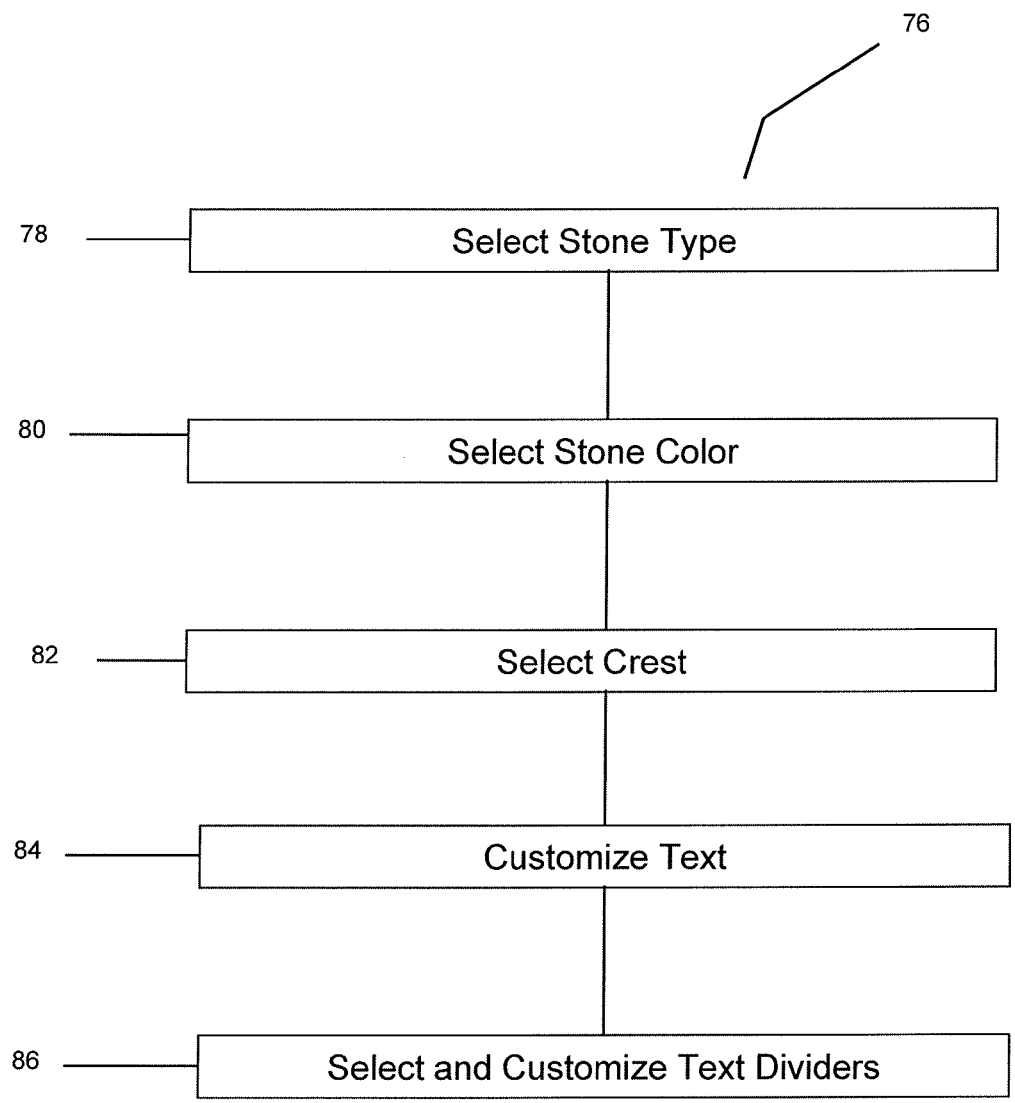
FIG. 5 illustrates a flowchart of a process for customizing the product top of a ring in accordance with one embodiment of the present invention.

FIG. 5 illustrates a flowchart 76 of the design ring top step of box 68 of FIG. 4. Each of the boxes may indicate possible features of the ring top that may be selected and customized by users. For each of these features, the system may be pre-populated with all of the available options for the described feature where all of the available options may have been previously paired down in the catalog set up. In some cases, where the available options are affected by the selection of another option, the available options may be updated to eliminate or provide additional suitable options given the previously selected options. For example, if a selection of no bezel text divider is selected, the options for the type of bezel text divider may be removed, hidden, grayed out, or otherwise made unavailable. In designing and customizing a ring, the user may be able to select from the pre-populated and/or updated options for each feature. When the user selects a particular feature, the system may automatically display an image of the ring incorporating the selected features, along with the other features that the user has already selected. Thereby, the user may be able to view an image of the ring as it is designed and customized.

In some embodiments, for particular features, the user may be provided with an option to incorporate a custom design, rather than a pre-populated option for that particular feature. In that circumstance, the image displayed by the system may not be able to depict the custom feature, but may indicate that a custom feature has been selected. The user may be able to describe and request outside custom artwork for such custom features, and custom artwork representatives may create the outside custom artwork and incorporate it into the designed ring.

In designing and customizing the ring top, the user may select and customize, for example, the stone type incorporated into the ring (box 78), the color of the selected stone (box 80), the crest design (box 82), text to be incorporated on the bezel of the ring (box 84), and characters or figures to divide the bezel text (box 86). Still other options may include stone features such as the undersurface texture and effect or surface texture and effect or stone cut, for example. Still other ring top options may be provided.

Figure 6:
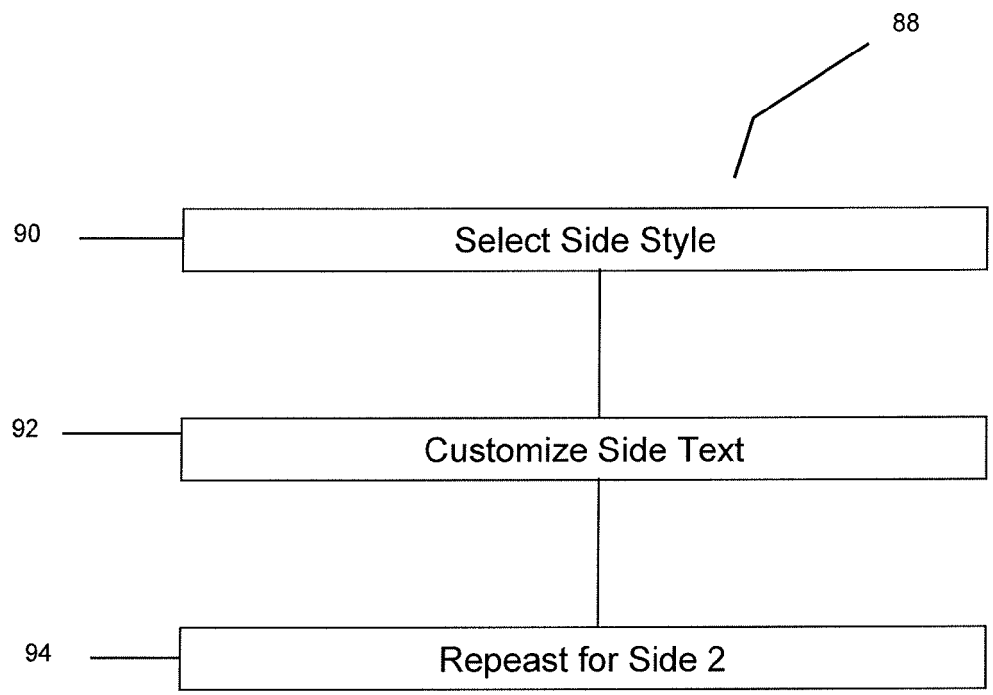
FIG. 6 illustrates a flowchart of a process for customizing the sides of a ring in accordance with one embodiment of the present invention.

FIG. 6 illustrates a flowchart 88 of the design ring sides step of box 70 of FIG. 4. Again, each of the boxes may indicate possible features of the ring sides that may be selected and customized by users. As with the ring top, for each of these features, the system may be pre-populated with all of the available options for the described feature, where the available options may have previously been paired down by the catalog set up and the options may be updated each time a selection is made where the options are affected by the selection. The user may be able to select from the pre-populated options for each such feature or, in some cases, opt to incorporate a custom feature. The system may automatically display an image of the ring incorporating the selected features, along with the other features that the user has already selected.

In designing and customizing the ring sides, the user may select and customize, for example, the style of the ring sides (box 90) and any text to be incorporated on the sides (box 92). As indicated at box 94, the user may repeat the steps of designing the ring sides on the second side of the ring.

Figure 7:
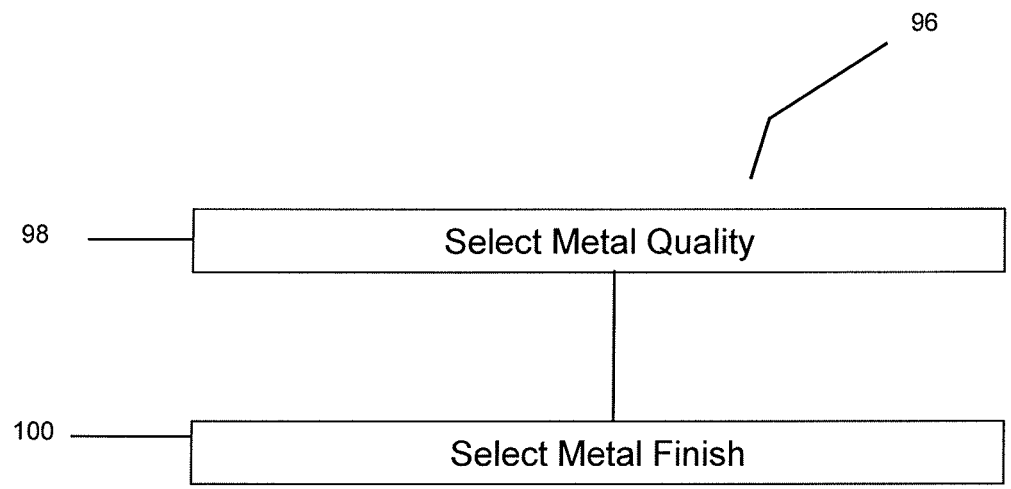
FIG. 7 illustrates a flowchart of a process for customizing the metals used in a ring in accordance with one embodiment of the present invention.

FIG. 7 illustrates a flowchart 96 of the select metal quality and finish step of box 72 of FIG. 4. During this process, the user may be permitted to select the metal quality for the ring, such as 10-karat white gold or 14-karat yellow gold, as shown at box 98, and may also be permitted to select the metal finish for the ring, as depicted at box 100. Each of the options for metal quality and metal finish may be pre-populated in the system, permitting the user to select from all available options that may include all metals offered by the manufacturer or a subset thereof based on the catalog set up and/or based on design features that may restrict the type of metal to be used, for example.

FIGS. 8-27 illustrate embodiments of images of the user interface of the ring design system 10. Each figure illustrates different steps in the design and customization of a ring using the ring design system 10. These images each involve merely one embodiment of the interfaces that may be used for some of the operations in the design and customization. Other interfaces with other selection features and other arrangements may also be used.

Figure 8:
FIG. 8 illustrates a product inclusion page in accordance with one embodiment of the present invention.

FIG. 8 illustrates a catalog set up page 102 in accordance with one embodiment. A user may perform the catalog set up step of box 32 of FIG. 2 via catalog set up page 102. The ring design system 10 may be pre-populated with all of the possible styles and sizes of rings available. Via catalog set up page 102, the user may select one or more styles and sizes of rings to be made available for design and customization for a particular event. As depicted in FIG. 8, the catalog set up page 102 may have images 104 of ring styles and sizes with boxes that permit the user to select those ring styles and sizes that will be made available for customization. The catalog set up page 102 may also have a drop down menu 106 that permits the user to navigate directly to different sizes and styles of rings (i.e., large rings, small rings, women's rings, etc.). This navigation may facilitate more quickly identifying the sizes and styles that the user desires to include in the catalog for a given event. However, particular styles of rings across several sizes may be selected and vice versa. The ring sizes and styles that the user selects may be those that will be available for customization in the remaining operations provided by the system 10.

Figure 9:
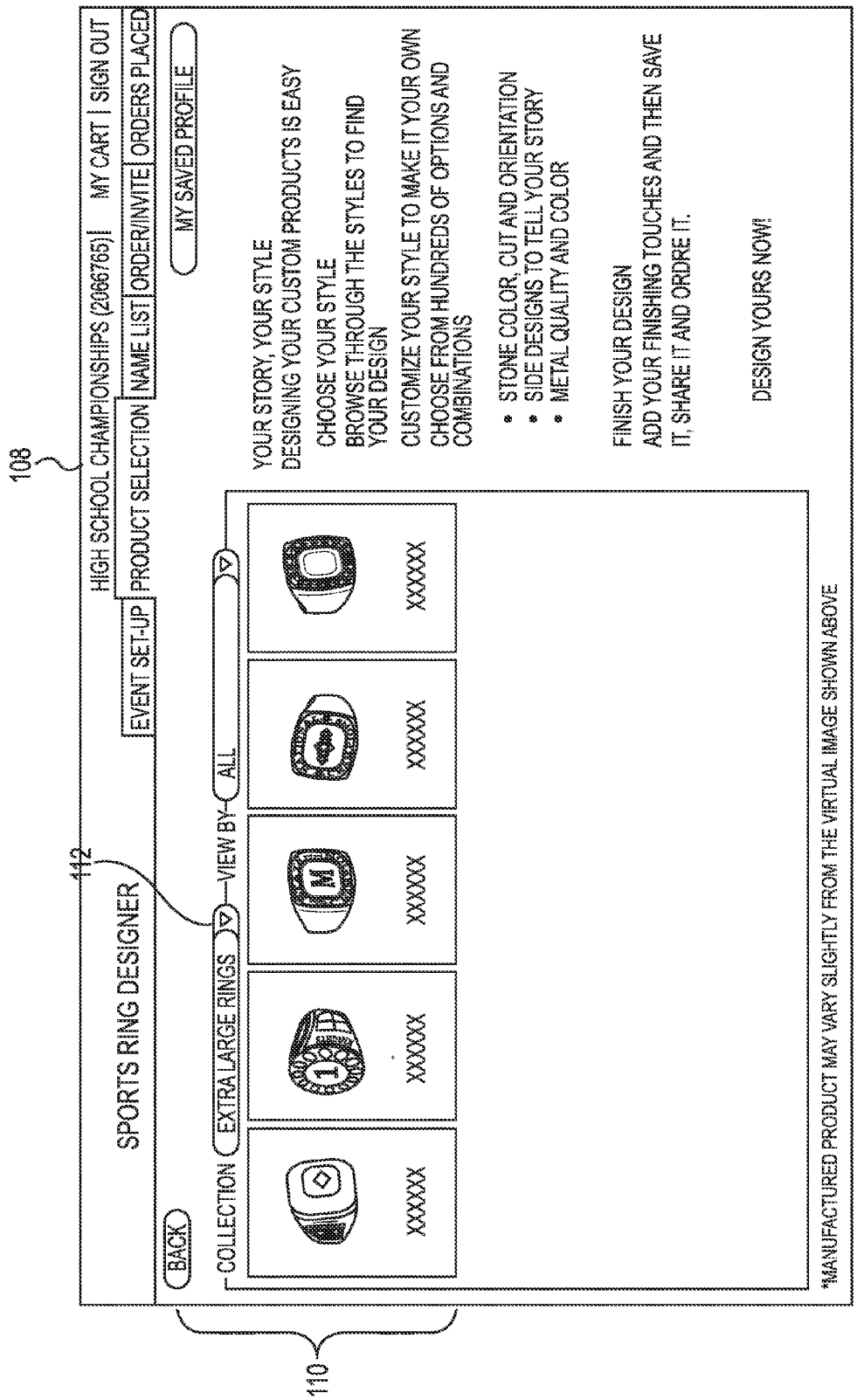
FIG. 9 illustrates a product selection page in accordance with one embodiment of the present invention.

FIG. 9 illustrates a product selection page 108 in accordance with one embodiment of the invention. A user may perform the step of choosing the product to design of box 36 of FIG. 2 via product selection page 108. As depicted, the product selection page 108 may display images 110 of each of the ring sizes and styles that were selected via the catalog set up page 102 of FIG. 8, and thereby made available for customization for a particular event. Optionally, the page may include a drop down menu 112 that permits the user to view images of only rings of certain sizes or styles, such as medium rings, large rings, or extra-large rings. Via product selection page 108, the user may select one of the styles and sizes of ring to customize. For example, the user may select a ring size and style by clicking on the desired ring image tile 110. The system may then prompt the user to customize the selected ring size and style. In other embodiments, once a user selects a ring size and style, such a ring size and style may be highlighted and a further step of selecting a "customize and design" button, for example, may be executed by the user to move on to customizing the ring.

Figure 10:
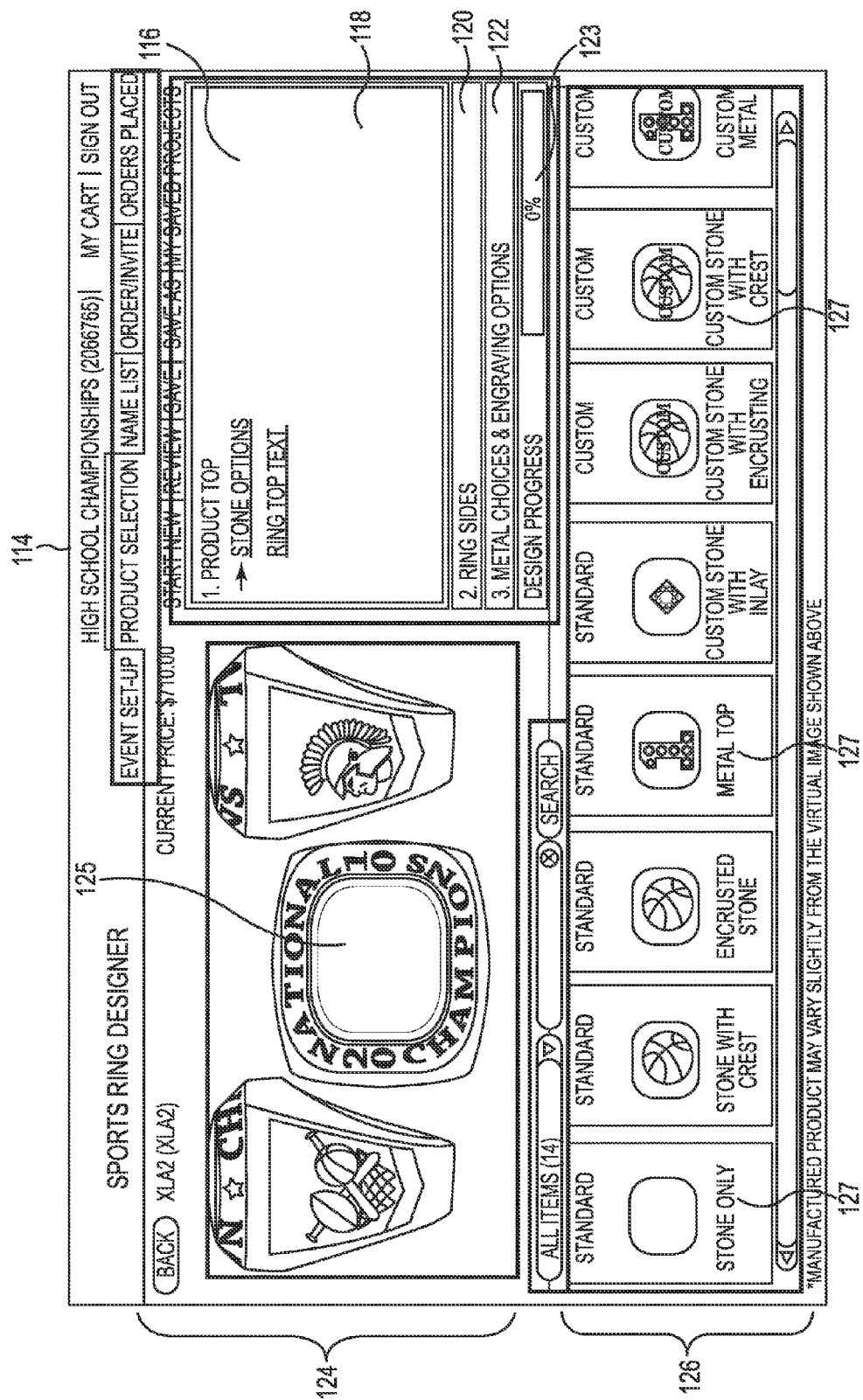
FIG. 10 illustrates a basic ring design page in accordance with one embodiment of the present invention.

FIG. 10 illustrates a general ring customization page 114 in accordance with one embodiment of the invention. The ring customization page 114 may incorporate a customization and checklist panel 116. Customization panel 116 may walk the user through the customization process. That is, it may permit the user to select from each of the aspects of the ring that may be customized: the ring top (118), the ring sides (120), and the ring metal choice and engraving (122). The customization panel also may optionally include a progress bar 123 or status indicator for providing a visual illustration of the progress of the ring design and customization. As shown, the progress bar 123 can illustrate the percentage of steps that have been completed in the ring design and customization process.

For each aspect 118, 120, and 122 of the ring to be design and customized, the ring design system 10 may prompt the user to select each customizable feature available via a checklist, as depicted. When the user selects a feature from the checklist in customization panel 116, the available options for the selected feature may appear as image tiles 127 in options panel 126. The user may select the desired feature by clicking on the corresponding image tile 127. When the user selects a feature, the ring design system 10 may automatically displays in ring image panel 124 an image 125 of the ring incorporating the selected features. As depicted, the ring image panel 124 displays images 125 of the ring top and both ring sides.

Figure 11:
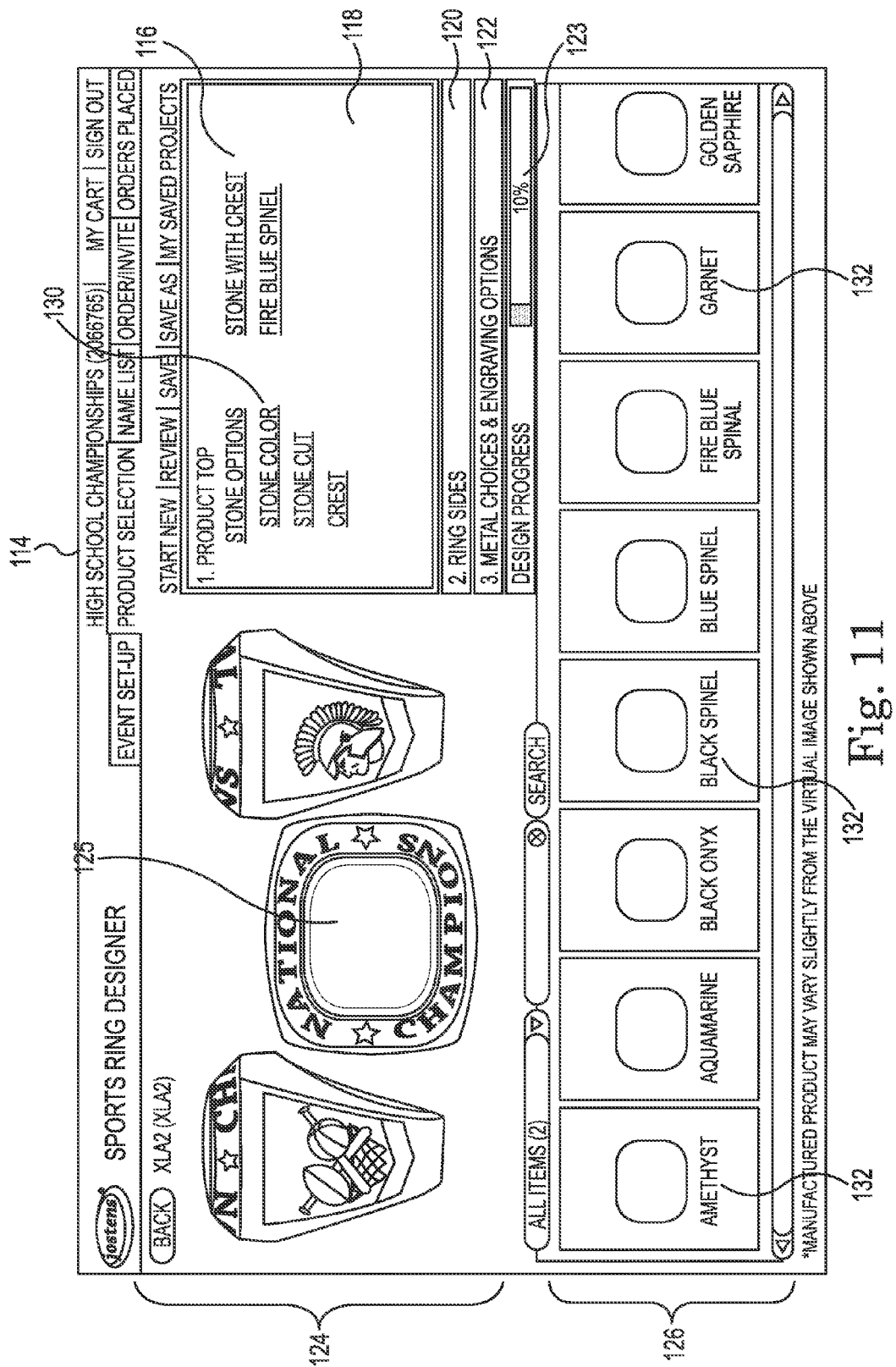
FIG. 11 illustrates a ring design page depicting options for customization of the color of the stone in the product top of the ring in accordance with one embodiment of the present invention.

FIG. 11 illustrates a ring customization page 114 depicting customization options for stone color in accordance with one embodiment. The customization panel 118 shows available customizable features for stone style, stone color, stone cut, crest, and bezel spellout. The stone color feature has a check mark appearing next to it to show that the customer has selected a stone color for the ring. Image tiles 132 in options panel 126 show the available options for stone color. The ring image panel 124 displays an image of the customized ring incorporating the selected features, including the selected stone color. In the particular case shown, the third stone from the right has been selected (apparent from the highlighted boundary of the image tile) and the stone color of the selected tile matches the stone color in the image panel 124. It is noted that the stone color is shown in the image panel 124 both in the top view of the ring and in both of the side views as well.

Figure 12:
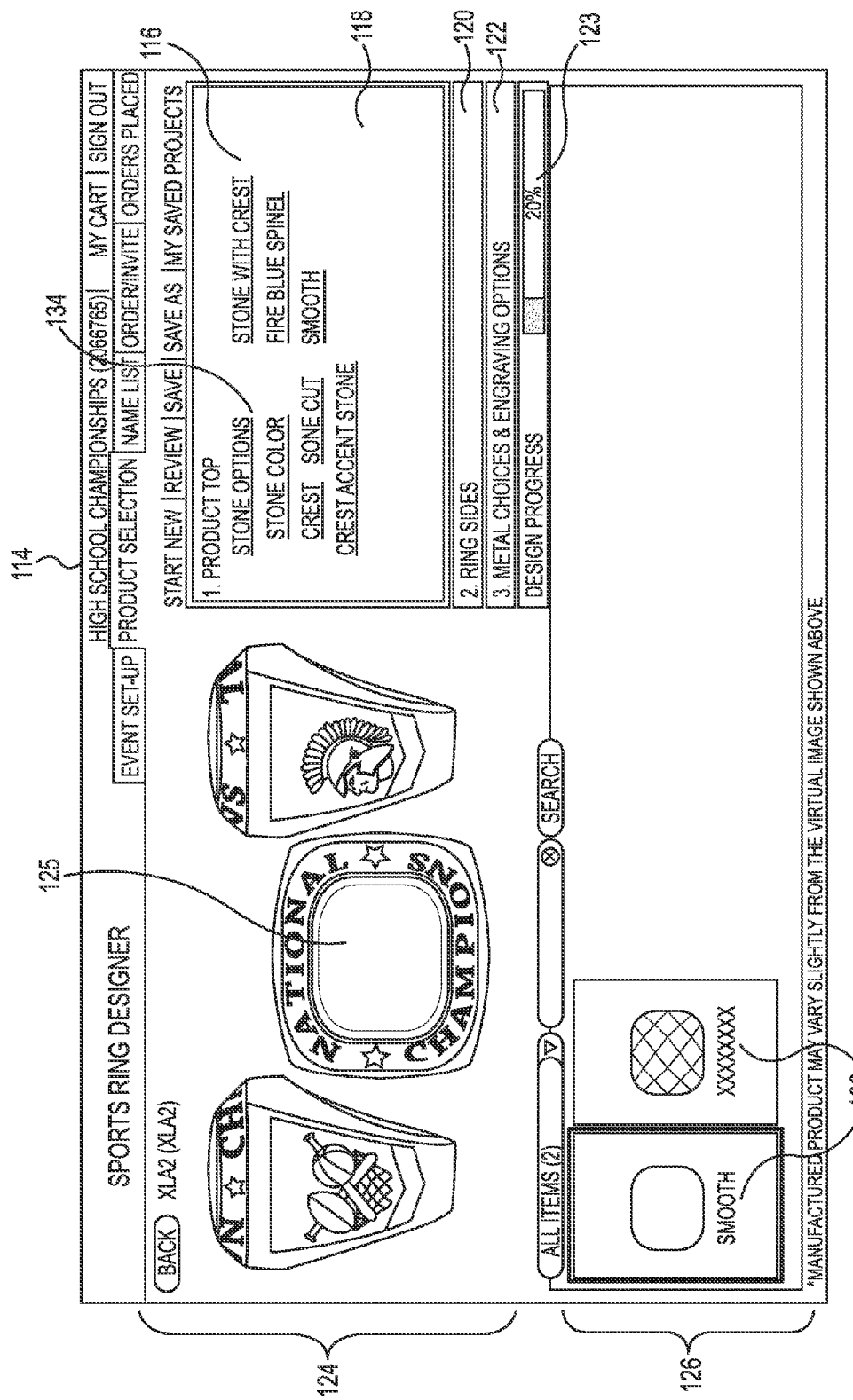
FIG. 12 illustrates a ring design page depicting options for customization of the cut of the stone in the product top of the ring in accordance with one embodiment of the present invention.

FIG. 12 illustrates a ring customization page 114 depicting customization options for stone cut in accordance with one embodiment of the invention. The customization panel 118 shows available customizable features for stone style, stone color, stone cut, crest, and bezel spellout. The stone color feature and stone cut feature have check marks appearing next to them to show that the customer has selected a stone color and stone cut for the ring. Image tiles 136 in options panel 126 show the available options for stone cut, including smooth and diamond-cut facet. The ring image panel 124 displays an image of the customized ring incorporating the selected features, including the selected stone color and stone cut. In the particular case shown, the user has selected the left most option for stone cut, which is smooth. The stone in the image panel is correspondingly shown as smooth.

Figure 13:
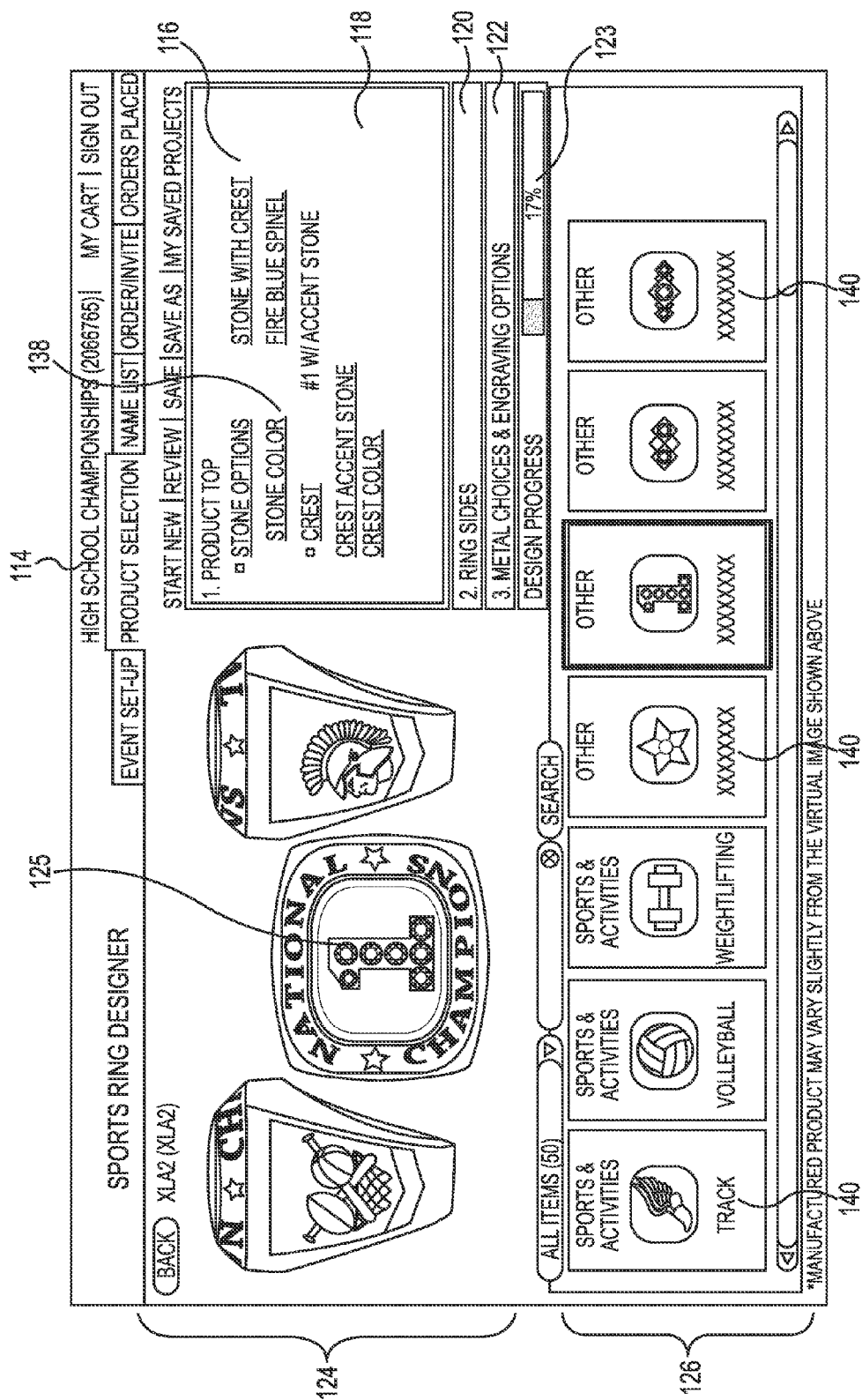
FIG. 13 illustrates a ring design page depicting options for customization of the crest in the product top of the ring in accordance with one embodiment of the present invention.

FIG. 13 illustrates a ring customization page 114 depicting customization options for crest style in accordance with one embodiment of the invention. The customization panel 118 shows available customizable features 138 for stone style, stone color, stone cut, crest, crest accent stone, crest color, and bezel spellout. The stone color feature and stone cut feature have check marks appearing next to them to show that the customer has selected a stone color and stone cut for the ring. Image tiles 140 in options panel 126 show the available options for crest style, such as track, volleyball, weightlifting, star with 12 pt Stone, #1 with Accent Stones, etc. The ring image panel 124 displays an image of the customized ring incorporating the selected features, including the selected crest style. In the particular case shown, the user has selected the #1 with accent stones, and the image panel 124, including the top and side views, has been updated accordingly.

Figure 14A:
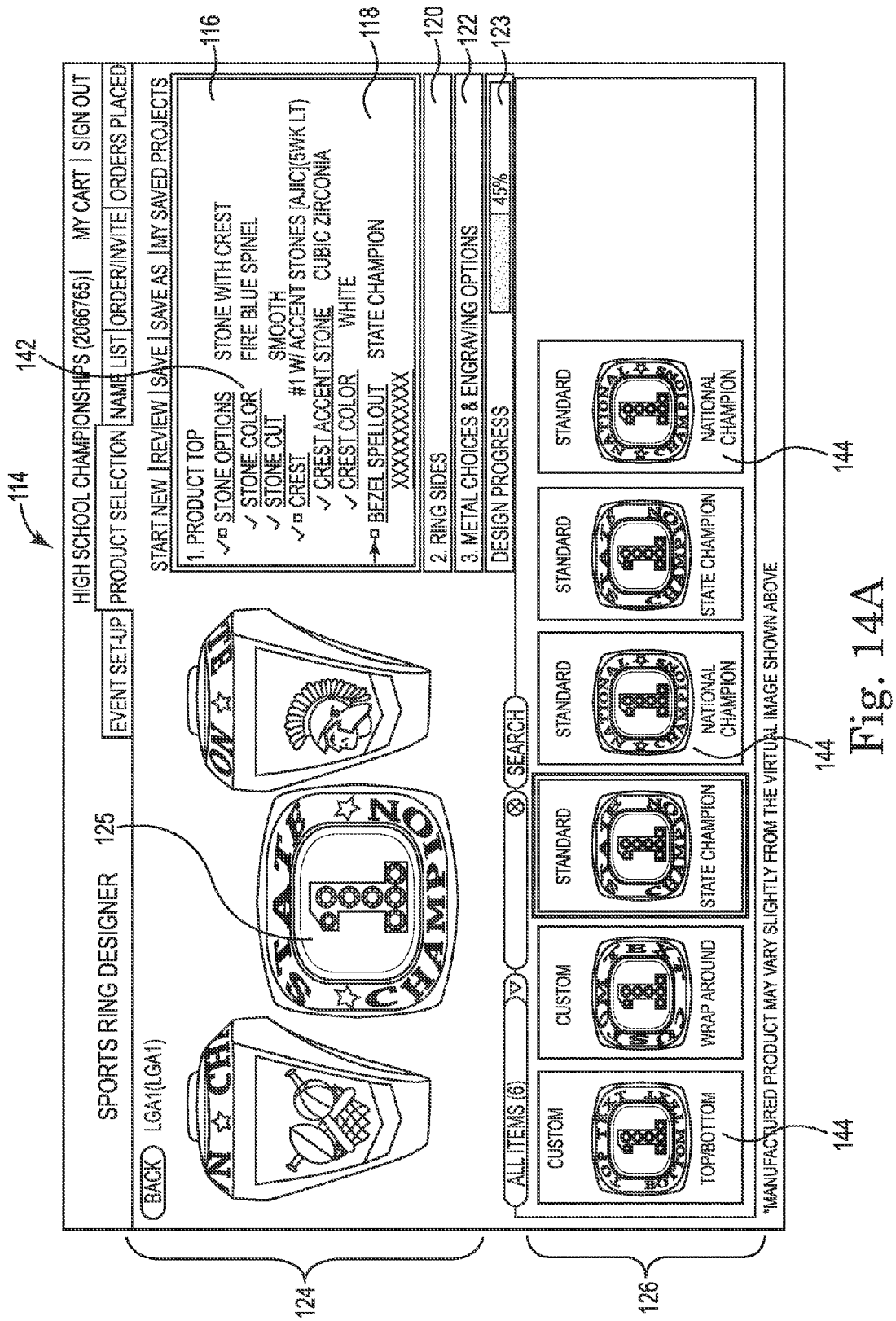
FIG. 14A illustrates a ring design page depicting options for text on the bezel of the ring in accordance with one embodiment of the present invention.

FIG. 14A illustrates a ring customization page 114 depicting customization options for bezel text in accordance with one embodiment of the invention. The customization panel 118 shows available customizable features 142 for stone style, stone color, stone cut, crest, crest accent stone, crest color, and bezel spellout, and bezel text divider. The stone color feature, stone cut feature, crest style, crest accent Stone, and crest color features all have check marks appearing next to them to show that the customer has selected these features for the ring. Image tiles 144 in options panel 126 show the available options for bezel text. These options include standard options incorporating text such as "State Champion," "State Champions," "National Champion," and "National Champions." They also include custom options; if the user selects custom text, they may select their own text to incorporate into the bezel of the ring. This customization is discussed in more detail with respect to FIGS. 14B-14E. In either case, the ring image panel 124 displays an image of the customized ring incorporating the selected features, including the selected bezel text. In the case shown, the user has selected the "State Champion" option, which is the image tile that is the third from the left. The ring in the image panel has been updated accordingly. In addition, the user has selected a text divider, which is also appropriately shown in the image panel 124.

Figure 14B:
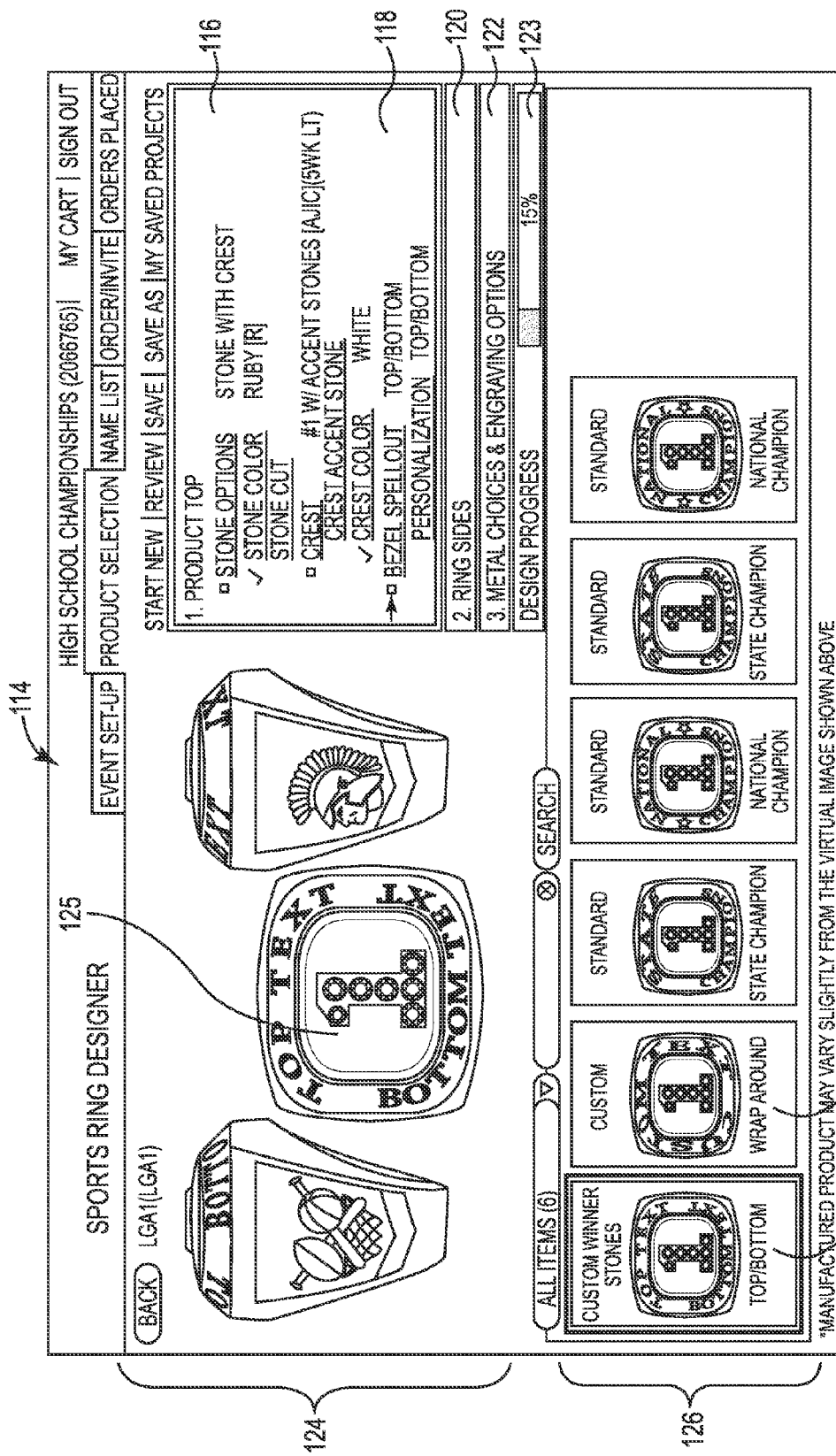
FIG. 14B illustrates a ring design page depicting a customization option for text on the bezel of the ring in accordance with one embodiment of the present invention.

FIG. 14B illustrates a ring customization page 114 where a user has selected a custom top/bottom text option 126A. Another custom option, not shown as selected, is a wraparound option 126B. In each of these custom cases, the user may provide the particular text that they wish to include on the bezel of their ring. In the top/bottom case the user may pick a word or phrase to be placed along the top of the bezel above the center stone and a bottom word or phrase to be placed along the bottom of the bezel below the center stone. The text may be oriented generally upright along the top and bottom of the ring and may change orientation as it extends around the sides of the bezel. In the wrap around case, the user may pick a word or phrase to be placed around the center stone as though the word or phrase is read, for example, from a viewpoint at the center of the stone. In this case, where portions of the word or phrase extend below the center stone, these portion may appear upside down to the wearer, for example. In both of these custom options or other custom options, the user may also select a type of divider and a number of dividers. To gather the personalization information in either of these custom options or other custom options, the user may be prompted with a personalization menu 115 as shown in FIG. 14C.

Figure 14C:
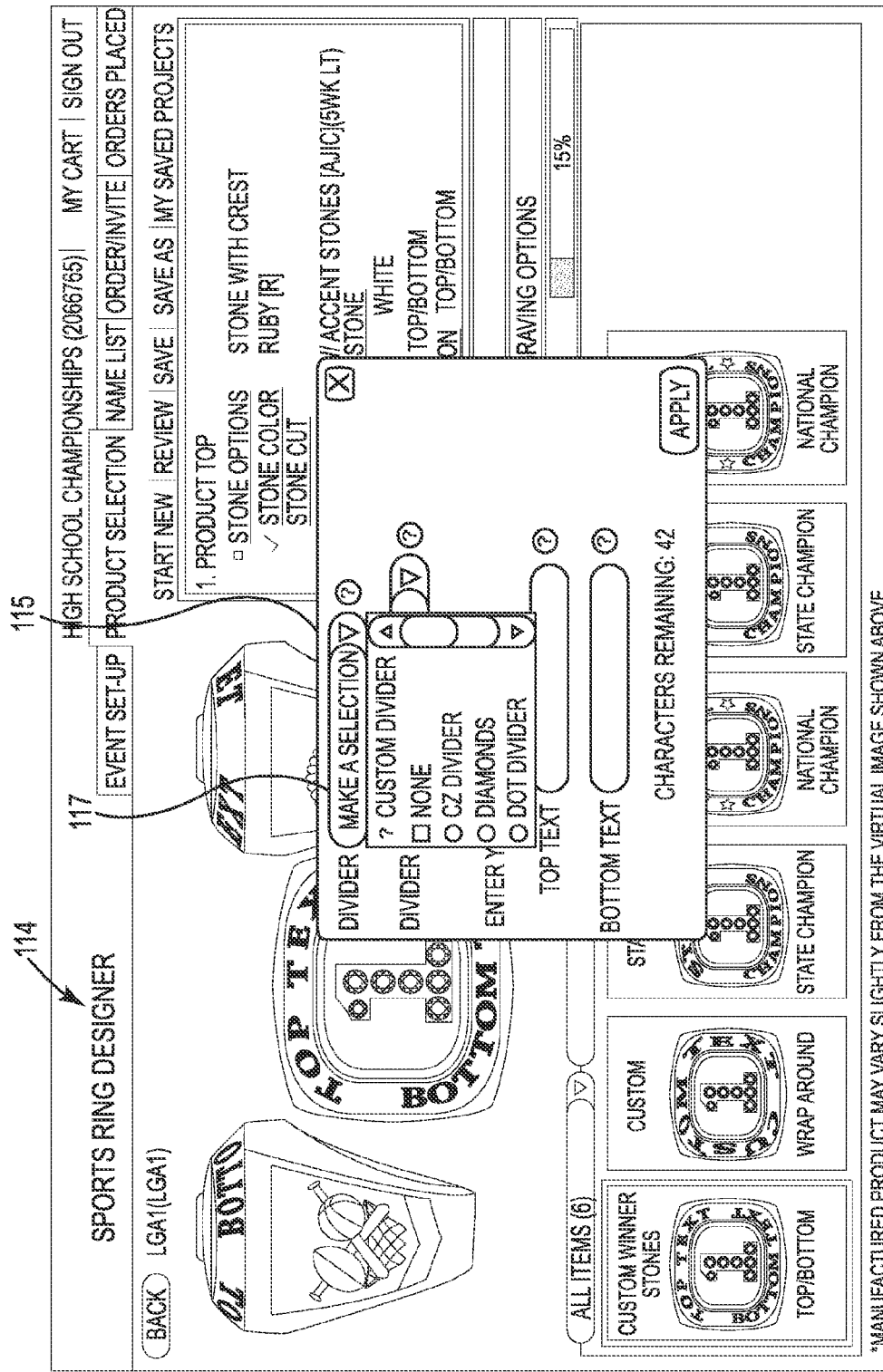
FIG. 14C illustrates a personalization menu for the customization option of FIG. 14B where a type of divider may be selected.
Figure 14D:
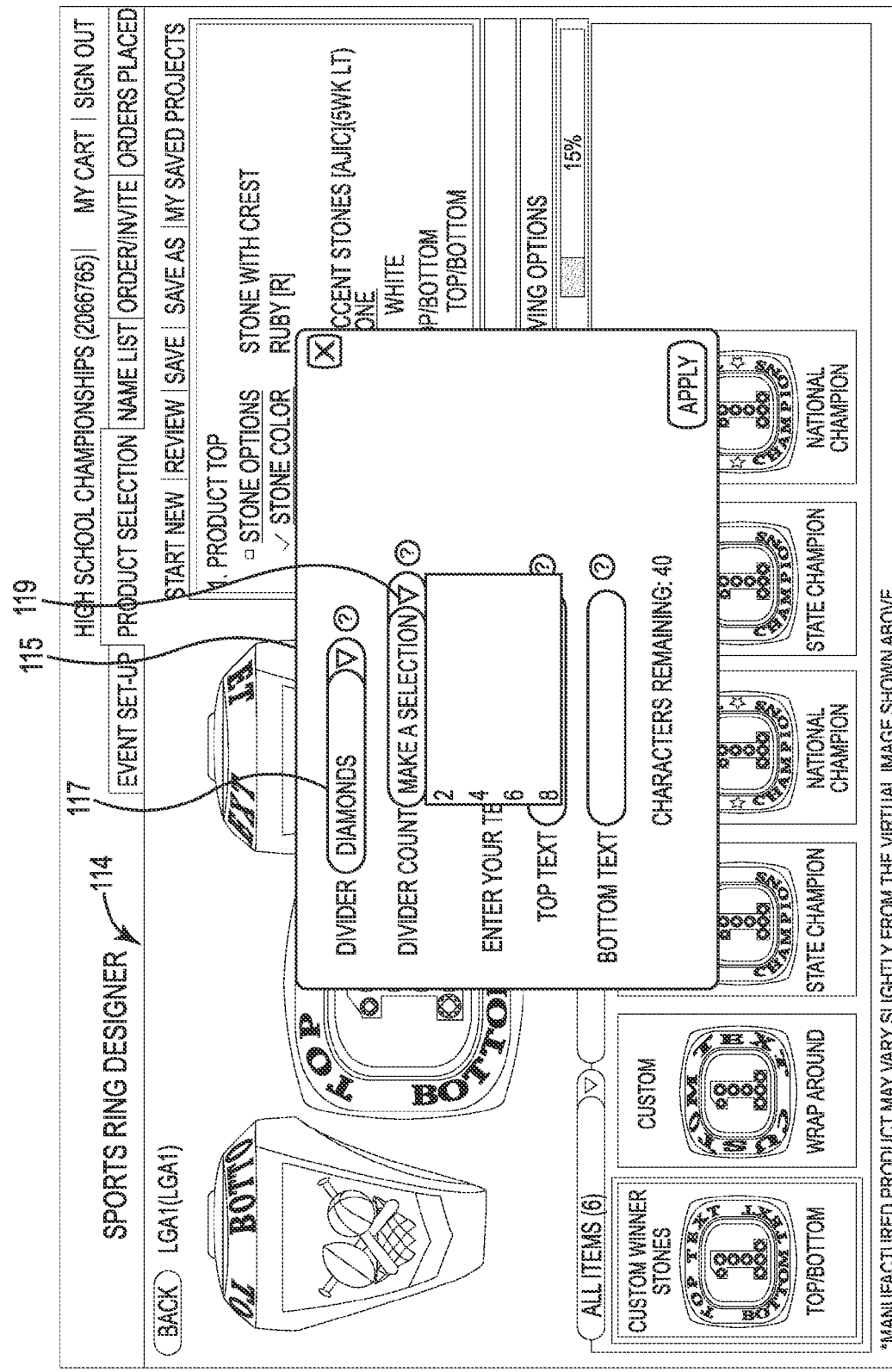
FIG. 14D illustrates the personalization menu of FIG. 14C where a number of dividers may be selected.

FIG. 14C shows a personalization menu 115 where the user has selected the top/bottom customization option. As shown, a drop down menu 117 is provided allowing the user to select the type of divider they wish to include on the ring. For example, the user may select between cubic zirconia, diamonds, dots, etc, or a divider may be omitted by selecting none. In the present example, the user has selected diamond dividers as shown in FIG. 14D. A number of dividers may also be selected as shown in FIG. 14D via another drop down menu 119. In the case of a top/bottom text option, the number of dividers may be in even multiples since one or multiple dividers may be placed on either side of the ring between the top and bottom text. Other arrangements may also be provided such as 1 divider on one side and not on the other. In the case of the wrap around option, integer values of dividers beginning with 1 may be provided since one or multiple dividers may be placed between the beginning and end of the wrapped text. Other arrangements including placement of dividers between words of a phrase in the wrap around or top/bottom option may also be provided.

Figure 14E:
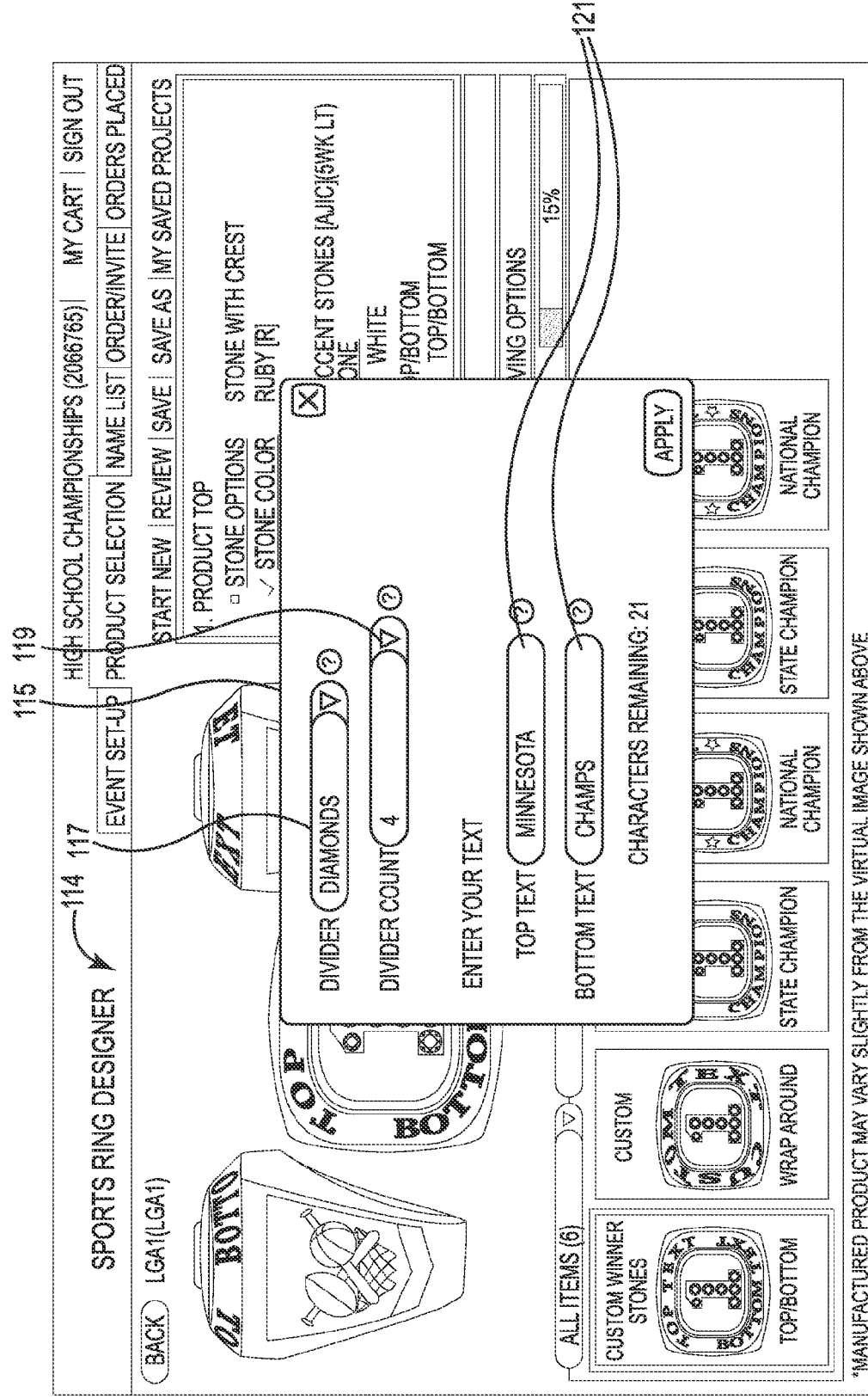
FIG. 14E illustrates the personalization menu of FIG. 14C where top text and bottom text may be entered.

FIG. 14E shows the personalization menu of FIG. 14C with four diamond dividers having been selected. In addition, FIG. 14E shows the menu for the top/bottom text option allowing for the user to enter top text and bottom text. As the user enters text in either input field, a characters remaining number continually provides an indication of how much space is left for text. It is noted that this number may be adjusted depending on the size of the ring and the number of dividers selected to maintain adequate space on the bezel of the ring and allow for the text to fit on the bezel. In the present case, the user has entered MINNESOTA in the top text box and CHAMPS in the bottom text box. The personalization menu may also include an "apply" button allowing for the several input fields on the personalization menu to be populated and then applied to the ring by clicking the apply button.

Figure 14F:
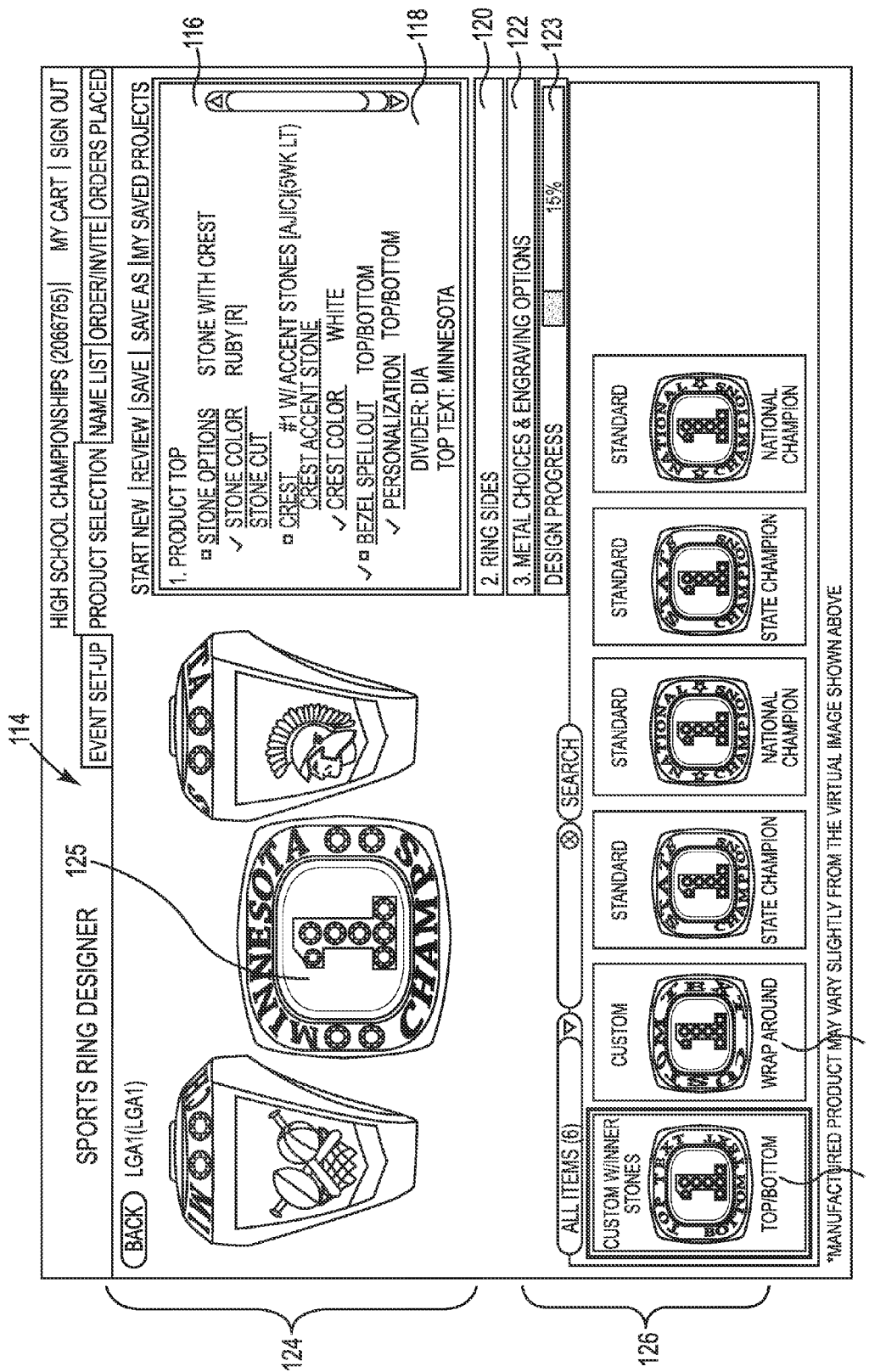
FIG. 14F illustrates the updated ring design page of FIG. 14B with the personalization modeled on the ring.

FIG. 14F shows the ring customization page of FIG. 14B with the ring in the ring image panel 124 having been updated with the number and type of dividers and the incorporated top and bottom text. The personalized bezel design shown in FIG. 14F is a true model of the personalized ring and bezel design. That is, the image portrayed is developed by a behind-the-scenes process that receives the personalization data, lays out the text and dividers, converts the two dimensional layout to a three-dimensional model of the bezel design and displays the three dimensional model. This process may allow the user to have a "what you see is what you get" experience with a three-dimensional customized and/or personalized ring. The details of this behind-the-scenes process are described in more detail with respect to FIG. 28, below.

Figure 15:
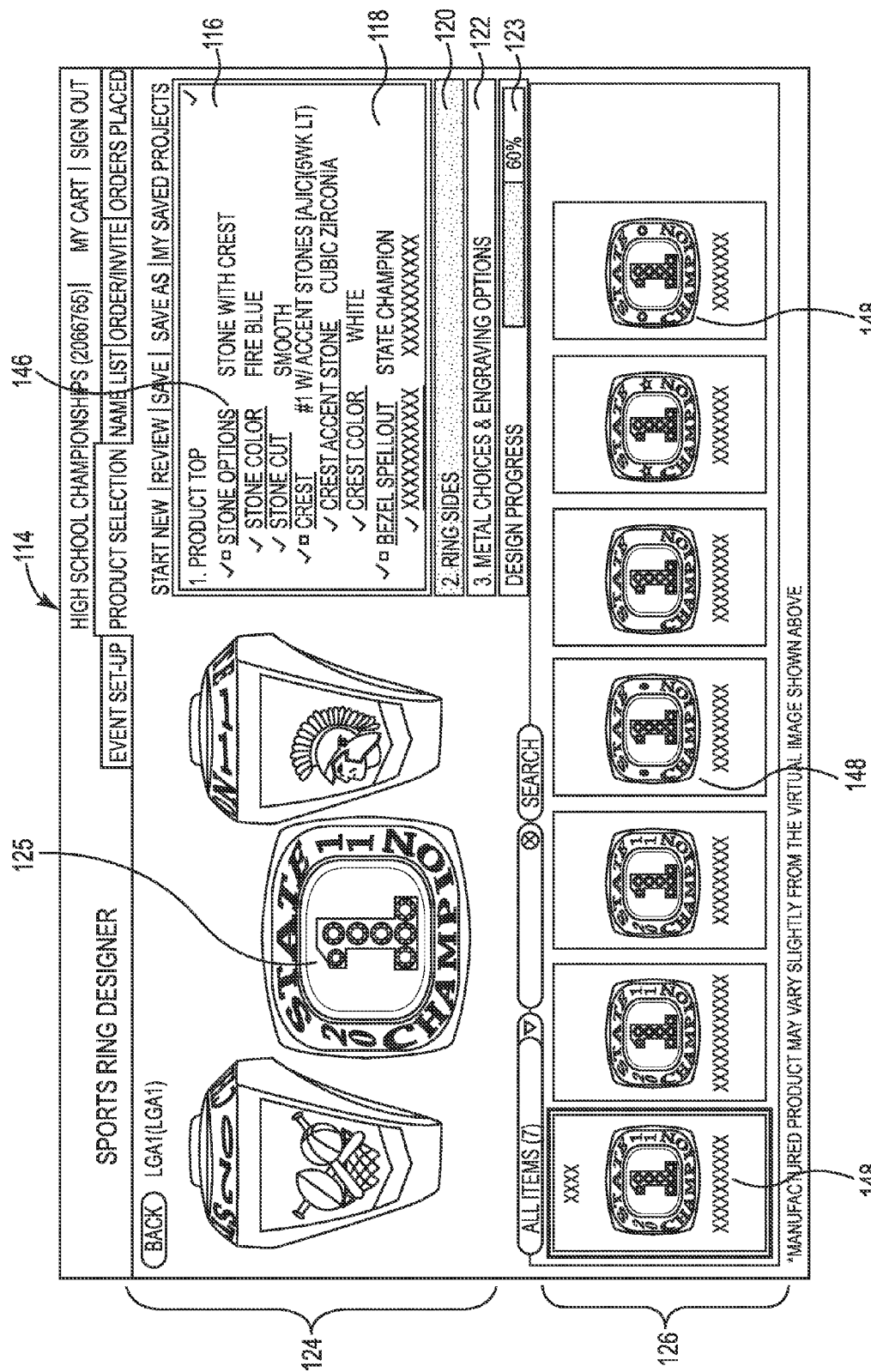
FIG. 15 illustrates a ring design page depicting options for text dividers on the bezel of the ring in accordance with one embodiment of the present invention.

FIG. 15 illustrates a ring customization page 114 depicting customization options for bezel text dividers in accordance with one embodiment of the invention. The customization panel 118 shows available customizable features 142 for the ring. Those features that have already been selected by the user have check marks appearing next to them to show that the customer has selected these features for the ring. Image tiles 148 in options panel 126 show the available options for bezel text dividers, including no divider, a year divider ("2009," for example), dots, stars, and stones. The bezel text dividers appear between the upper bevel text and the lower bezel text. The ring image panel 124 displays an image of the customized ring incorporating the selected features, including the selected bezel text dividers. In this particular case, the user has selected the left most option of bezel text dividers, which is "2011" with the "20" being on the left and the "11" being on the right, each separating the top text from the bottom text. The ring image panel 124 has been updated accordingly to show the selected option on the designed ring. It is noted that while several options including, for example, year dividers and stars have been presented here together with a standard option for the bezel text (i.e., "State Champion"), these and other divider options may be used with the custom bezel text option described with respect to FIGS. 14B-14F.

Figure 16:
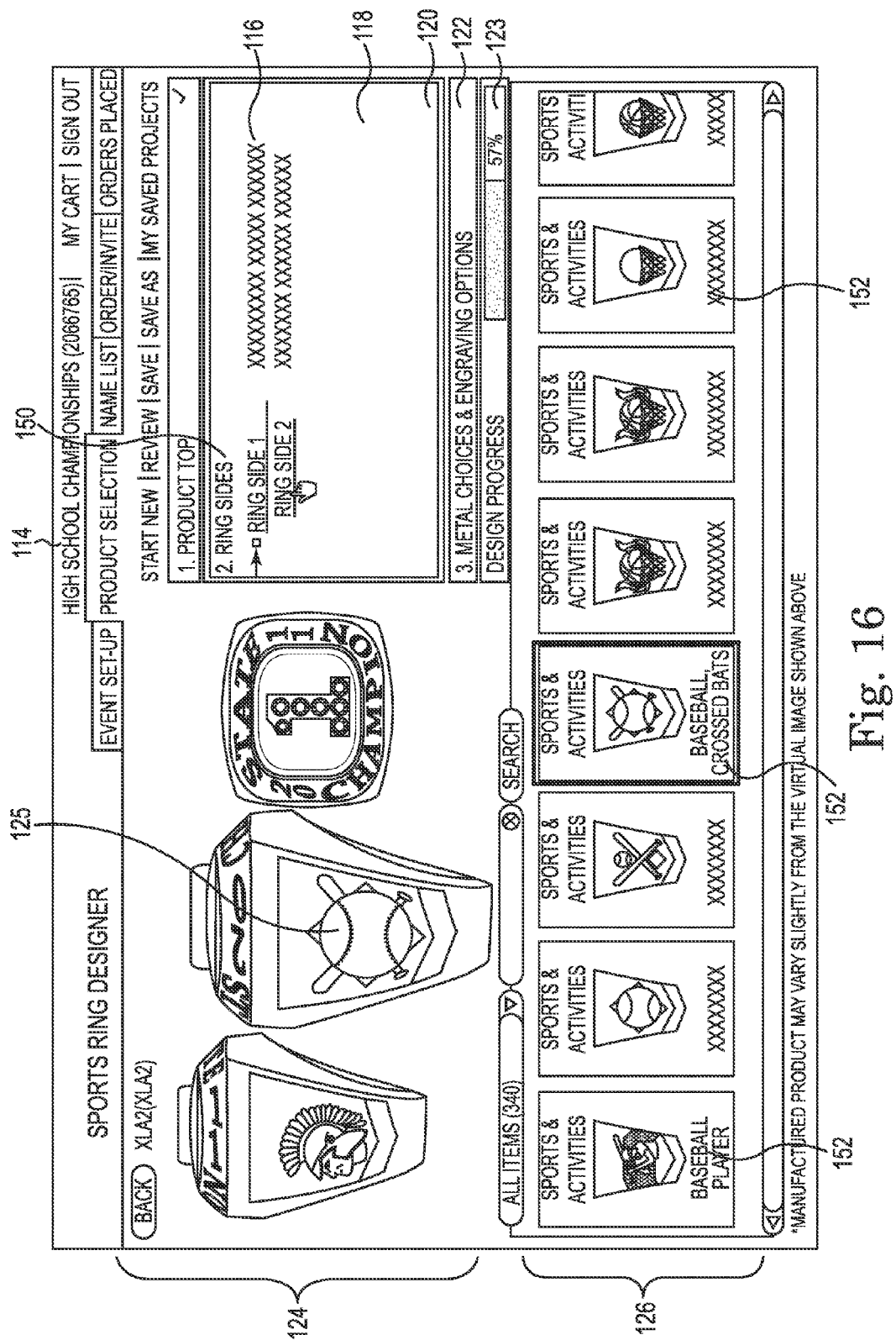
FIG. 16 illustrates a ring design page depicting options for customization of the sides of the ring in accordance with one embodiment of the present invention.

FIG. 16 illustrates a ring customization page 114 depicting customization options for the features of the ring sides. The customization panel 118 shows available customizable features 150 for ring side 1 style, ring side text, and ring side 2. Image tiles 152 in options panel 126 show the available options for ring side style, including graphics for a baseball player, baseball with baseball diamond, etc. The ring image panel 124 displays an image of the customized ring incorporating the selected features, including the ring side style. In particular example shown, the user has selected the baseball image with the bats crossing behind it. The ring image panel 124 has been updated to reflect that selection.

Figure 17:
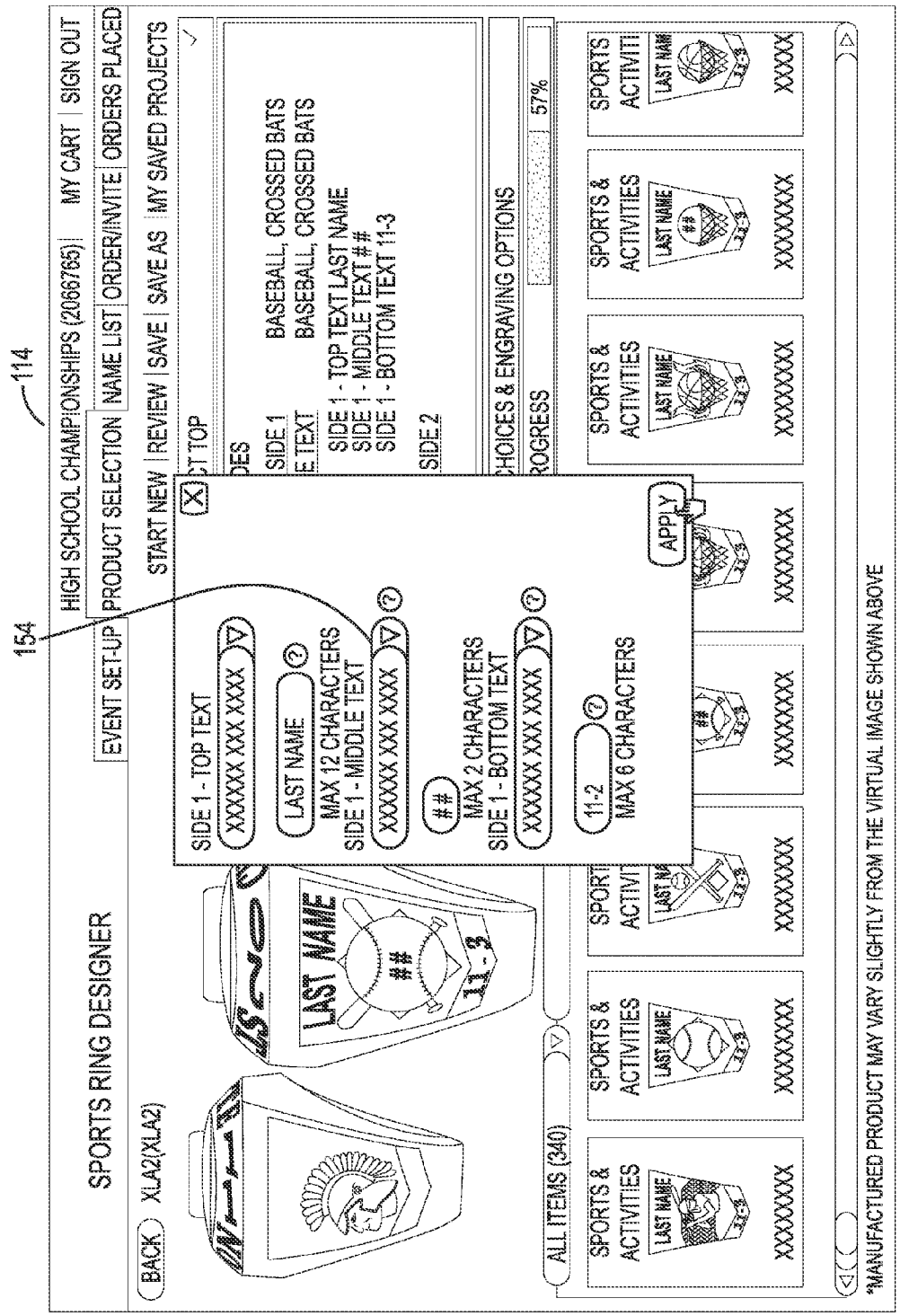
FIG. 17 illustrates a ring design page depicting options for customization of the text on the sides of the ring in accordance with one embodiment of the present invention.

FIG. 17 illustrates a ring customization page 114 depicting customization options for the ring side text. Similar to the personalization page 115 provided for the bezel text and dividers in the custom bezel option, the user interface of ring design system 10 provides the user with a text customization box 154. As depicted, text customization box 154 permits the user to enter text, including top text, middle text, and bottom text. The text customization box 154 identifies the maximum number of characters available for the text on each portion of the ring side and actively adjusts the number of characters available as the user inputs text. In this particular case, the user has entered, for example, "LAST NAME" for the top text "##" for the middle text, and "11-3" for the bottom text. As can be seen to the left and behind the text customization box 154, the ring image panel 124 reflects these entries.

Figure 18:
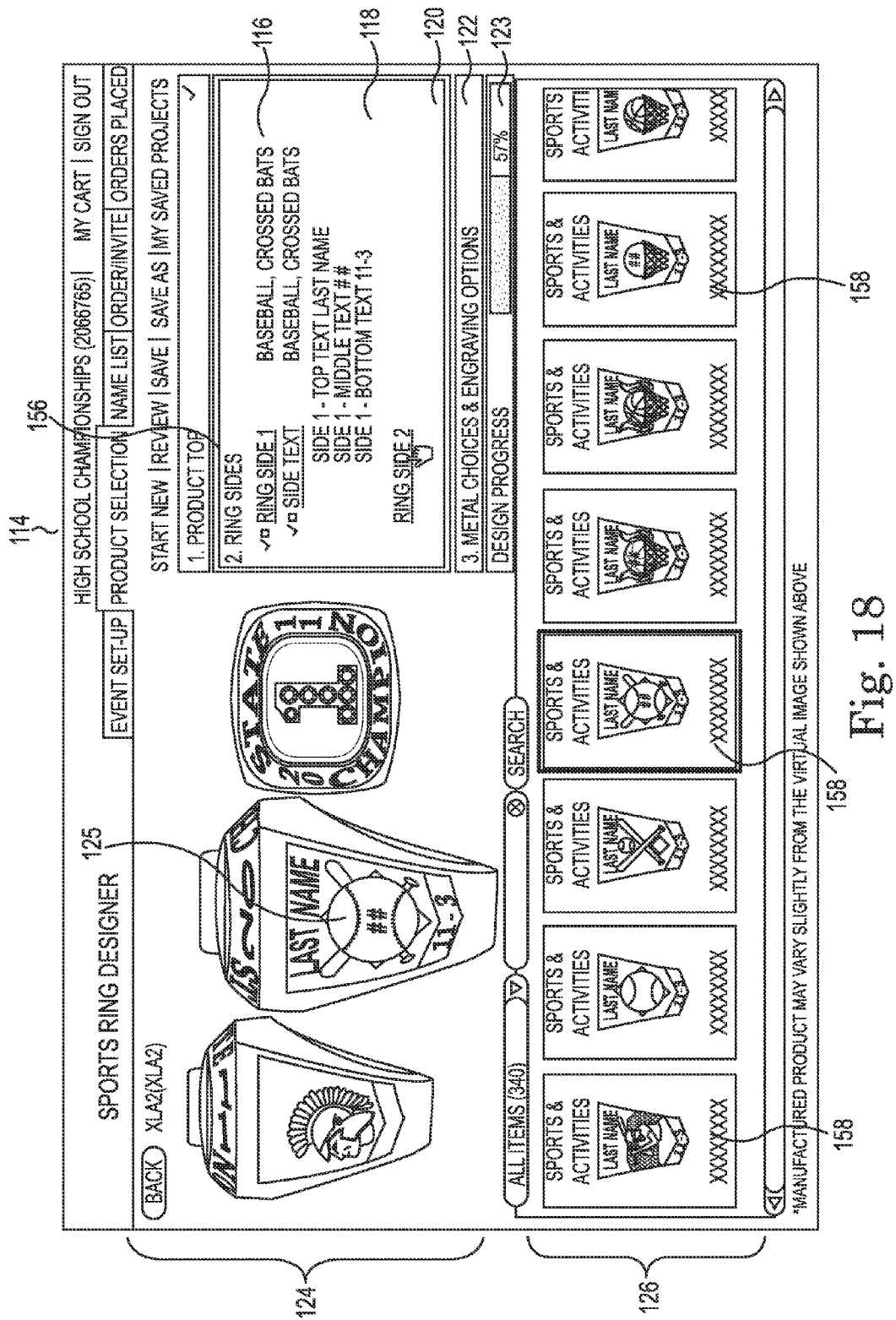
FIG. 18 illustrates a ring design page depicting options for customization of the sides of the ring incorporating customized text in accordance with one embodiment of the present invention.

FIG. 18 illustrates a ring customization page 114 depicting customization options for the features of the ring sides. The customization panel 118 shows available customizable features 156 for ring side 1 style, ring side text, each portion or ring side 1 text, and ring side 2. Image tiles 158 in options panel 126 show the available options for ring side style, incorporating the top, middle, and bottom text input by the user. That is, in contrast to the image tiles of FIG. 16, the image tiles 158 in FIG. 18 show the text that was input in customization box 154 of FIG. 17. The ring image panel 124 displays an image of the customized ring incorporating the selected features, including the ring side style and text. In the particular case shown, the user has maintained the selection of the baseball with the bats crossing behind it and the ring image panel 124 has been updated with the text entries from the customization box 154 of FIG. 17.

A series of the same or similar customization pages (i.e., those shown in FIGS. 16-18) may be provided for a second side or other sides of the ring or jewelry item.

As with the bezel text customization discussed with respect to FIG. 14F, the images in the options panel 126 as well as those on the ring in the ring image panel 124 include true models of the three-dimensional designs used on the rings. Many of these three-dimensional designs may be pre-loaded into the system 10 and available to the users. Other designs, such as the outside custom artwork requested at box 40 of FIG. 2 may be generated by the system 10. The pre-loaded designs as well as the outside custom artwork may be created through a behind-the-scenes process such that the designs for the sides of the ring are true models of the ring allowing the user to have a "what you see is what you get" experience with a three-dimensional customized and/or personalized ring. This behind-the-scenes process is described in more detail with respect to FIG. 29, below.

Figure 19:
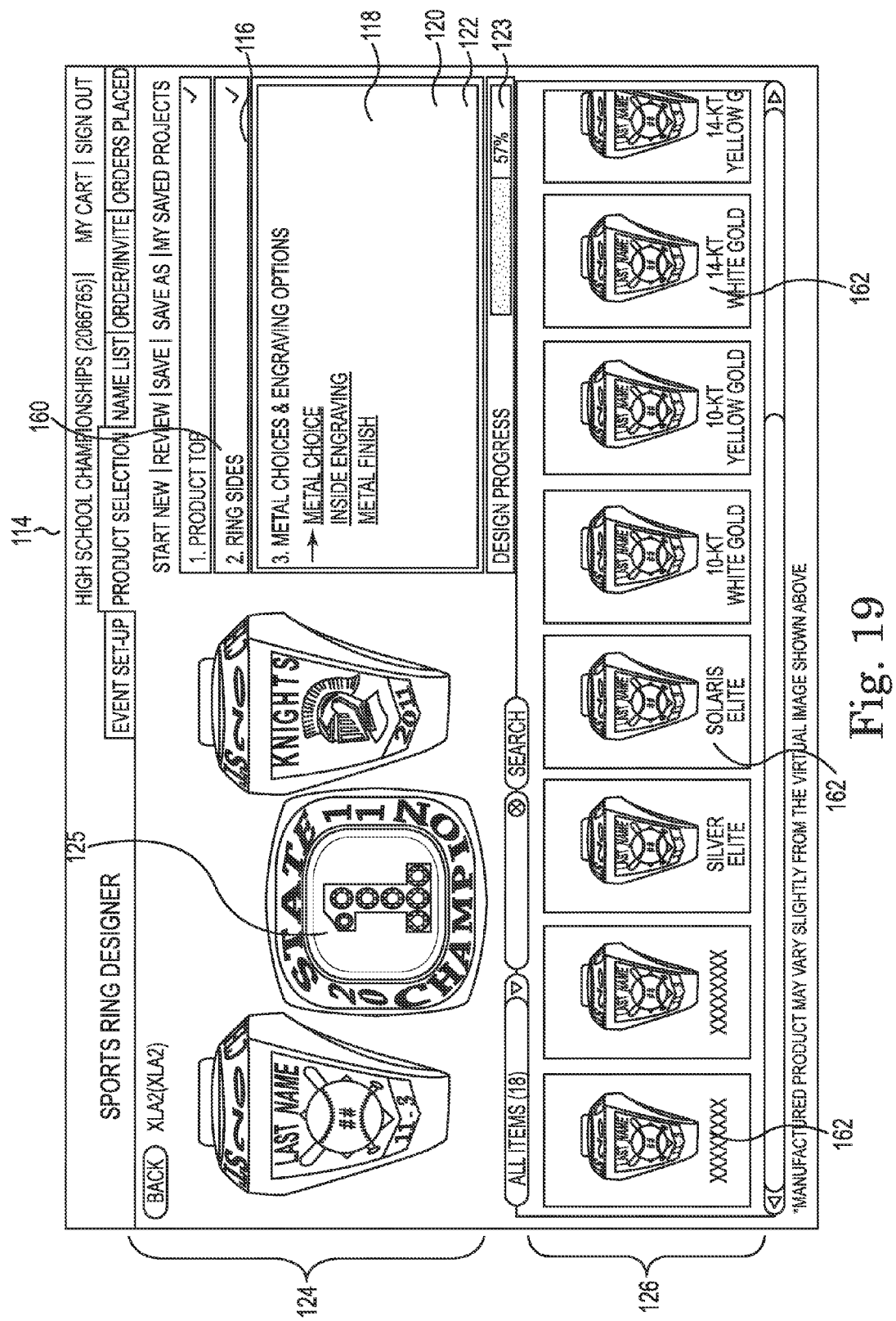
FIG. 19 illustrates a ring design page depicting options for customization of the metal quality of the ring in accordance with one embodiment of the present invention.

FIG. 19 illustrates a ring customization page 114 depicting customization options for the metal of the ring and optional engraving on the ring. The customization panel 118 shows available customizable features 160 for metal quality, inside engraving, and metal finish. Image tiles 162 in options panel 126 show the available options for metal quality, including 10-kt. white gold, 10-kt. yellow gold, 14-kt. white gold, etc. The ring image panel 124 displays an image of the customized ring incorporating the selected features, including the metal quality.

Figure 20:
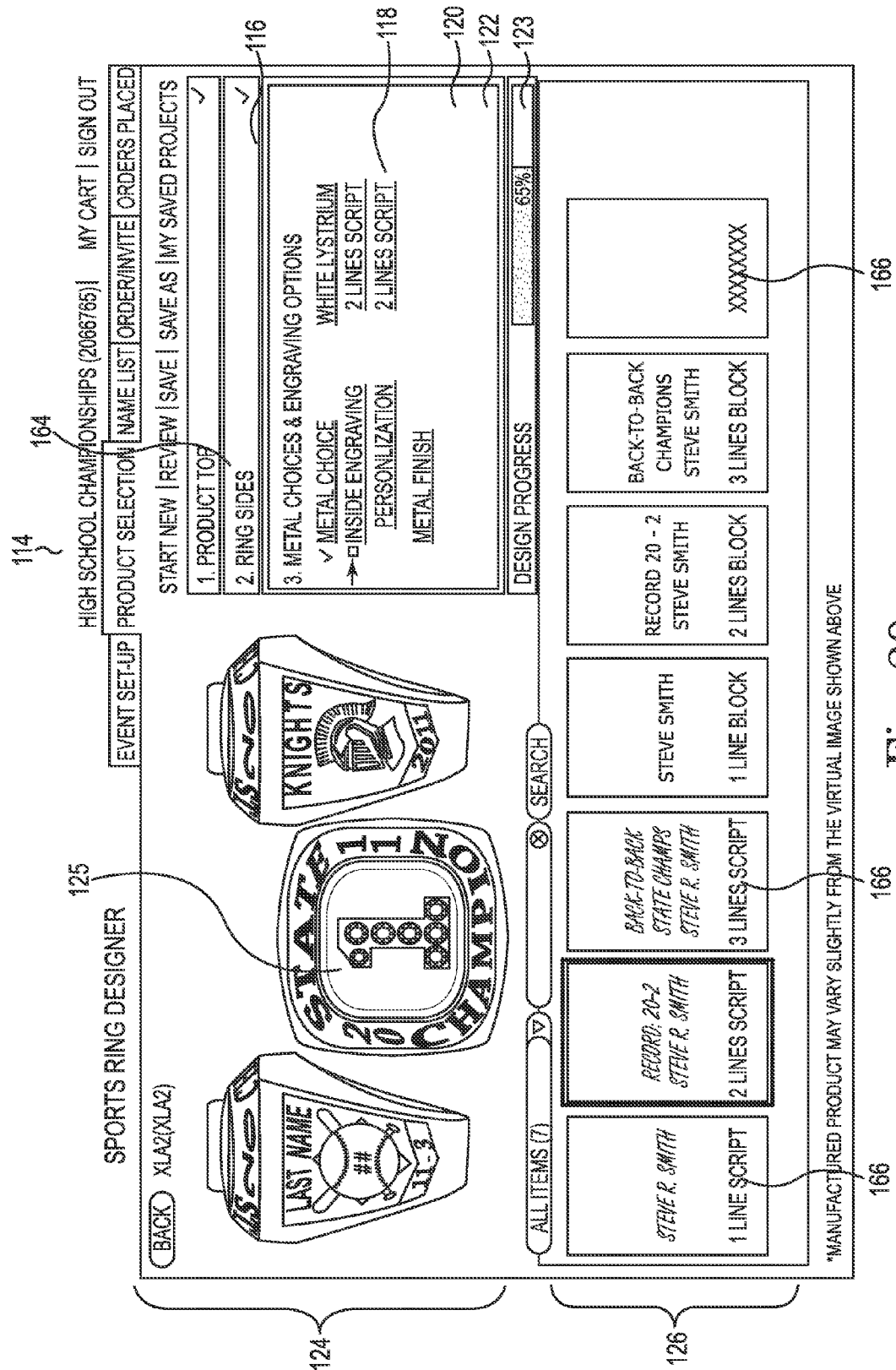
FIG. 20 illustrates a ring design page depicting options for customization of the engraving on the ring in accordance with one embodiment of the present invention.

FIG. 20 illustrates a ring customization page 114 depicting customization options for the engraving on the ring. The customization panel 118 shows available customizable features 164 for metal quality, inside engraving, personalization, and metal finish. Image tiles 166 in options panel 126 show the available options for engraving, such as 1, 2, or 3 line script, 1, 2 or 3 line block lettering, and no text.

Figure 21:
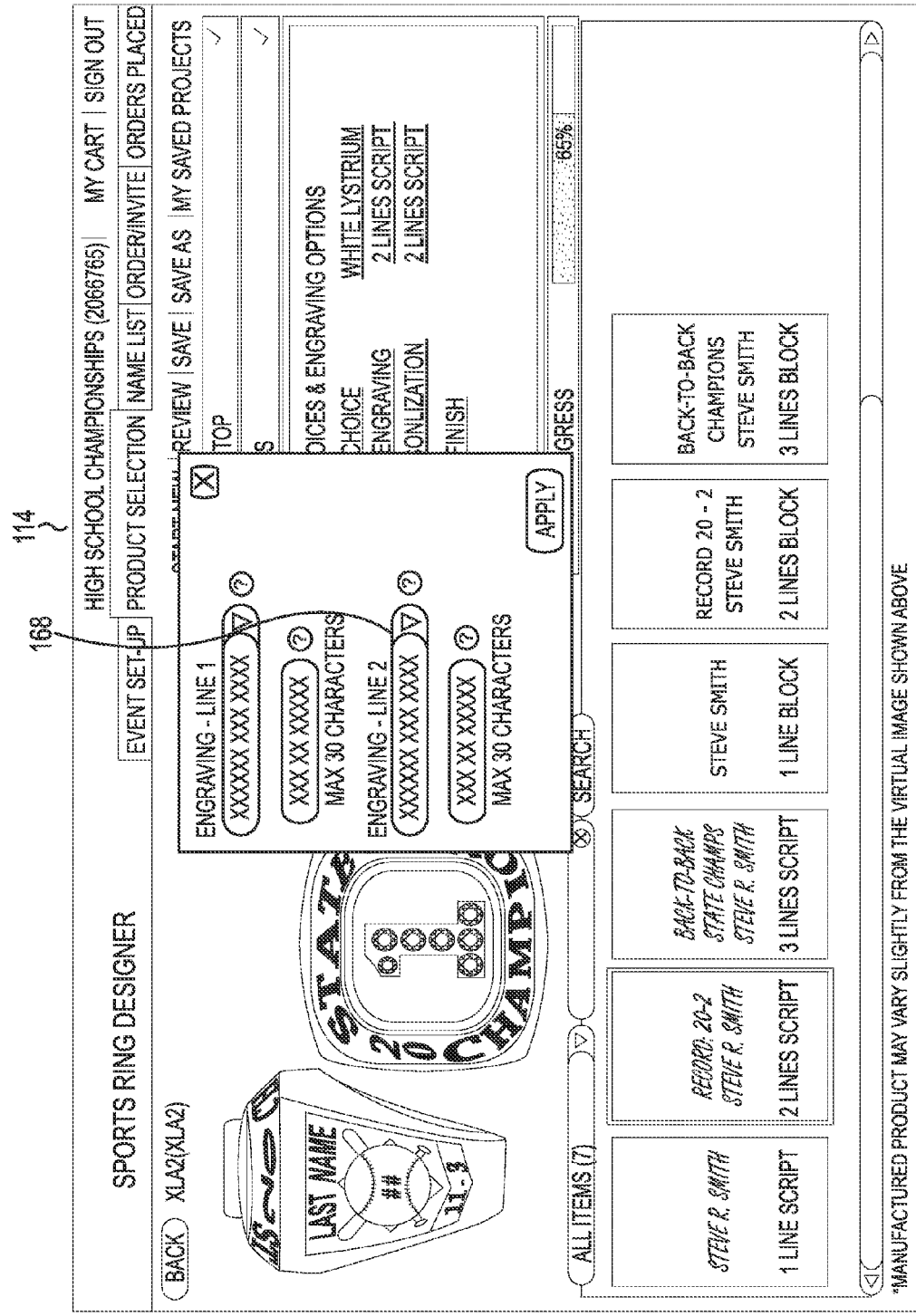
FIG. 21 illustrates a ring design page depicting a box permitting entry of customized text for the engraving on the ring in accordance with one embodiment of the present invention.

FIG. 21 illustrates a ring customization page 114 depicting customization options for the text of the engraving on the ring. The user interface of ring design system 10 provides the user with a text customization box 168. As depicted, text customization box 168 permits the user to enter text, including lines 1 and 2. Other numbers of lines may be provided in the box 168 depending on the selection made in FIG. 20. The text customization box 154 identifies the maximum number of characters available for the text on each line of the engraving. In some embodiments, a spiraling inside engraving option may be available, which may have a larger number of available characters.

Figure 22:
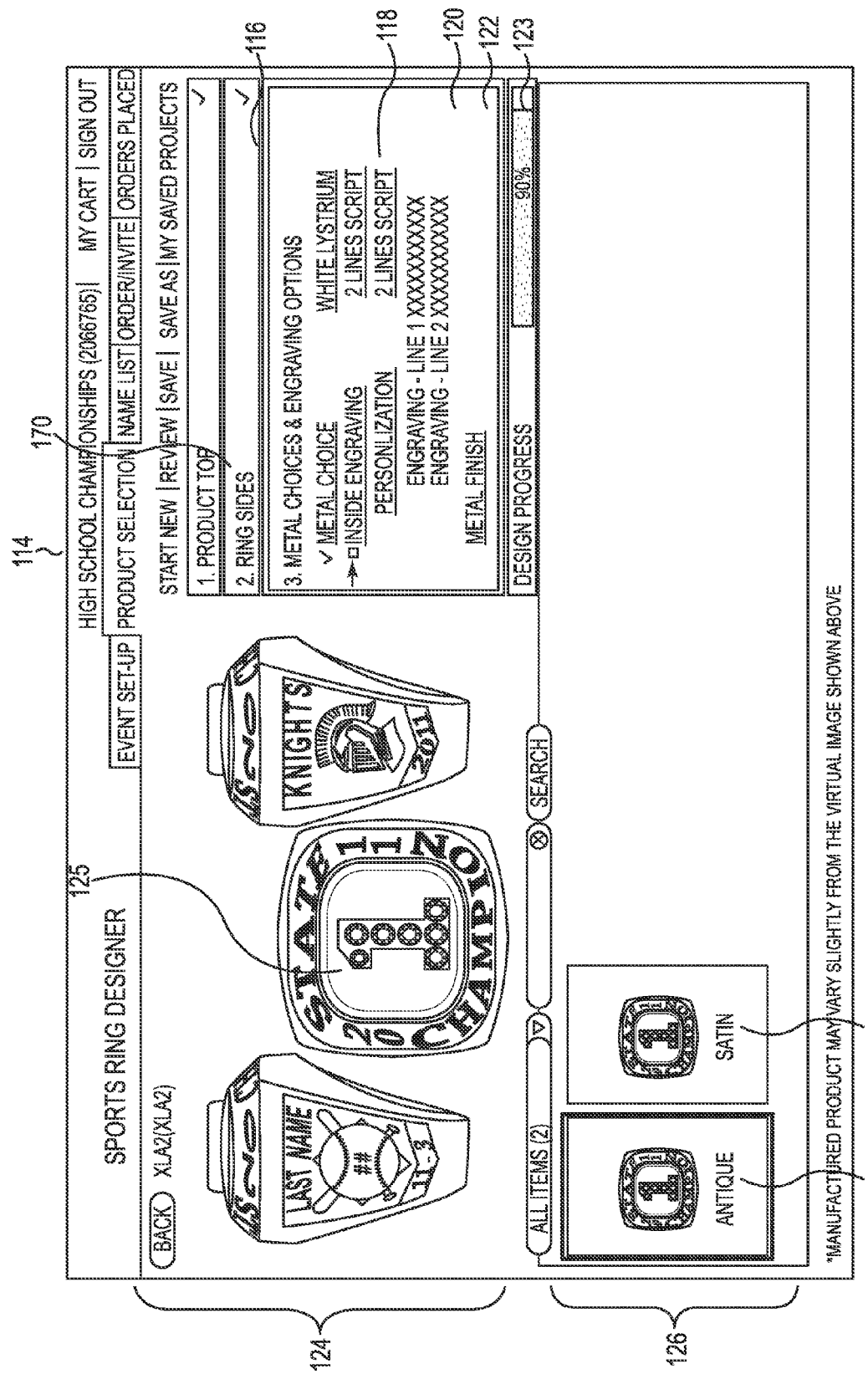
FIG. 22 illustrates a ring design page depicting options for customization of the metal finish of the ring in accordance with one embodiment of the present invention.

FIG. 22 illustrates a ring customization page 114 depicting customization options for the metal finish of the ring. The customization panel 118 shows available customizable features 170. Image tiles 172 in options panel 126 show the available options for metal finish, including antique and satin. The ring image panel 124 displays an image of the customized ring incorporating the selected features, including the metal finish.

Figure 23:
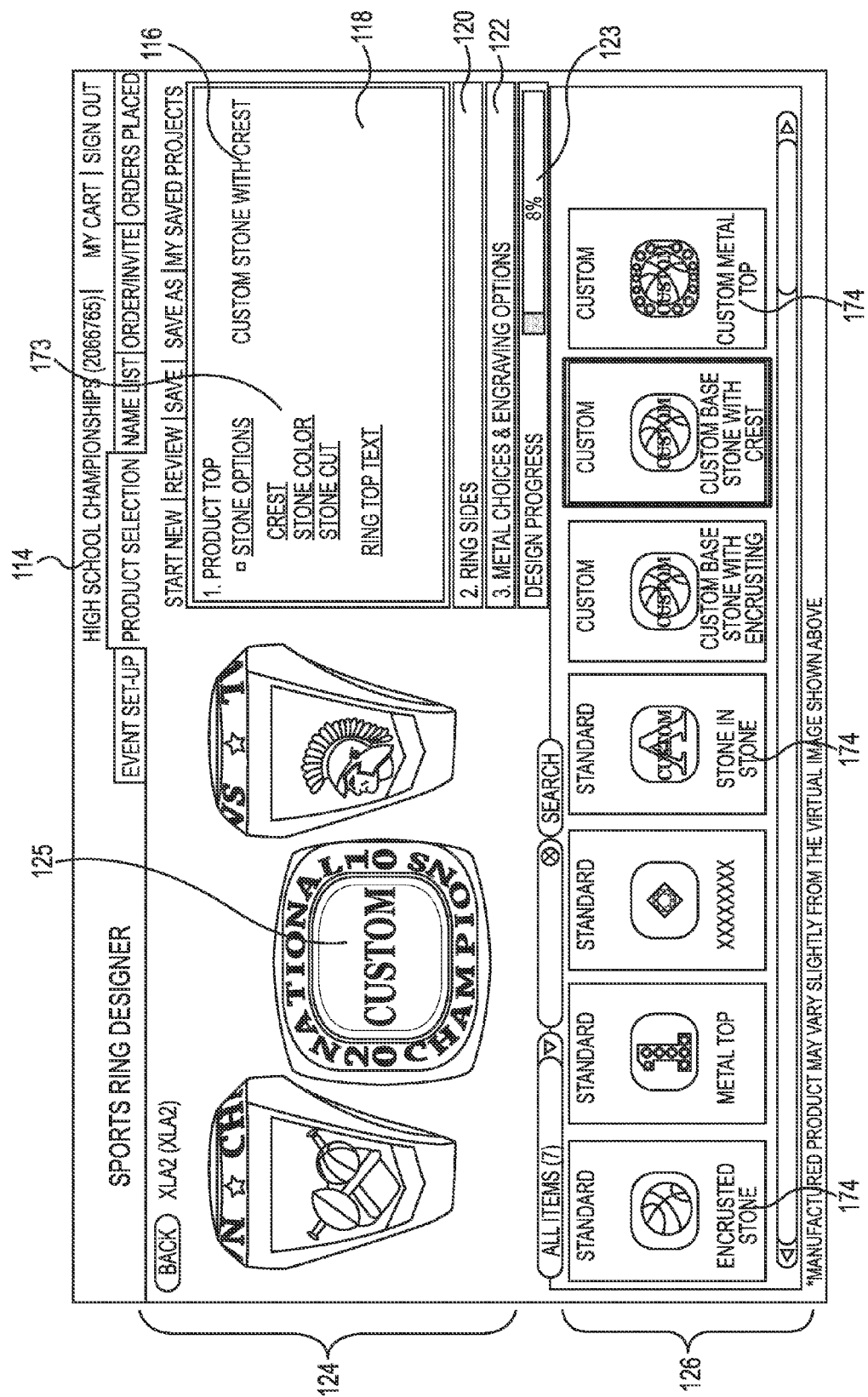
FIG. 23 illustrates a ring design page depicting options for customization of the ring to incorporate custom features that have not been pre-designed in accordance with one embodiment of the present invention.

FIG. 23 illustrates a ring customization page 114 depicting customization options for stone types, including custom options and are not pre-selected and available in ring design system 10. The customization panel 118 shows available customizable features 173, including stone types, crest, stone color, stone cut, and ring top text. Image tiles 174 in options panel 126 show the available options for stone types, including "encrusted stone," "metal top," and "stone with tubeset," as well as several "custom" options. Should the user select one of the custom options, the ring design system 10 will permit the user to describe and/or provide an example of the desired custom feature and request outside custom artwork. Custom artwork representatives may then create the requested custom artwork and incorporate it into the ring design. The ring image panel 124 displays an image of the customized ring incorporating the selected features; the selected custom feature may not be depicted because the corresponding imagery of the outside custom artwork may not be available at the time of the ring design process. Accordingly, the image instead shows "custom" to indicate that a custom feature has been selected.

Figure 24:
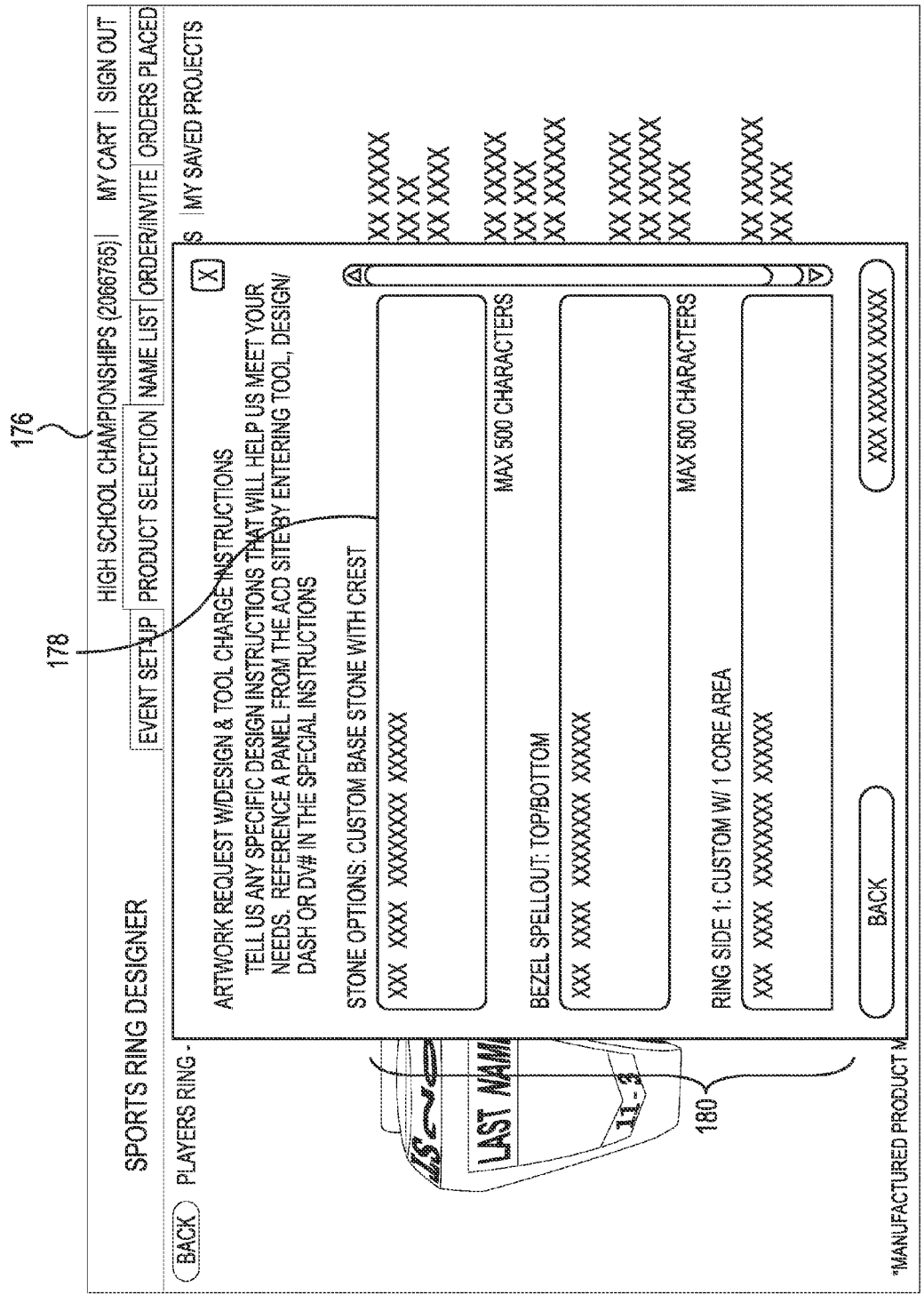
FIG. 24 illustrates a ring design page depicting a box permitting entry of information descriptive of custom artwork to be requested for incorporation into a ring in accordance with one embodiment of the present invention.

FIG. 24 illustrates an artwork request page 176. The user interface of ring design system 10 provides the user with an artwork request box 178. As depicted, artwork request box 178 permits the user to describe the requested custom artwork to be incorporated into the ring design. For example, the user may describe the style of stone requested, the bezel text, and the ring side style. In some embodiments, this request box 178 may refer to attached examples or concepts and an attachment button or option may be provided allowing the user to attach examples of the desired artwork. In other embodiments, a user may refer to a school logo or other icon or example and such may be provided by representatives 14, tracked down by the sales force 12, or otherwise acquired by the artwork representatives 18 for incorporation into the ring.

Figure 25:
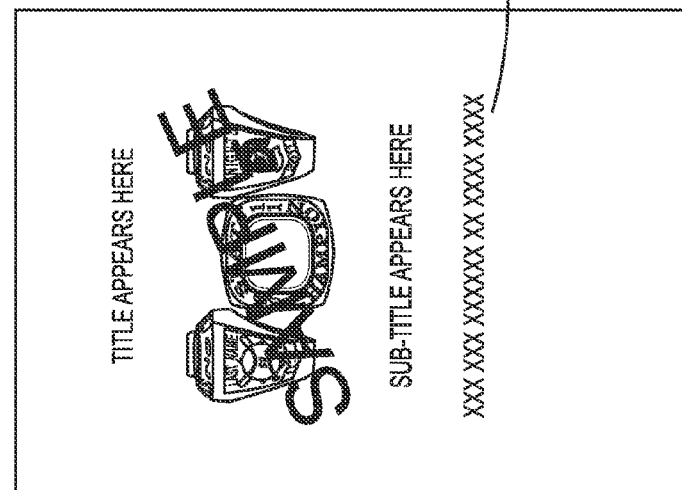
FIG. 25 illustrates a ring design page depicting a box permitting entry of information to customize advertising material for customized rings in accordance with one embodiment of the present invention.

FIG. 25 illustrates an advertising creation page 182. The user interface of ring design system 10 provides the user with an advertising creation box 184. As depicted in FIG. 25, the advertisement may be a flyer advertising the ring designed by the user. Advertisement creation box 184 permits the user to input text in text boxes 186, including the title of the flyer, a subtitle for the flyer, and a message to include in the text of the flyer. Advertisement creation box 184 may further display an image of the flyer as modified by the user, incorporating images of the designed ring as well as the text entered by the user.

Figure 26:
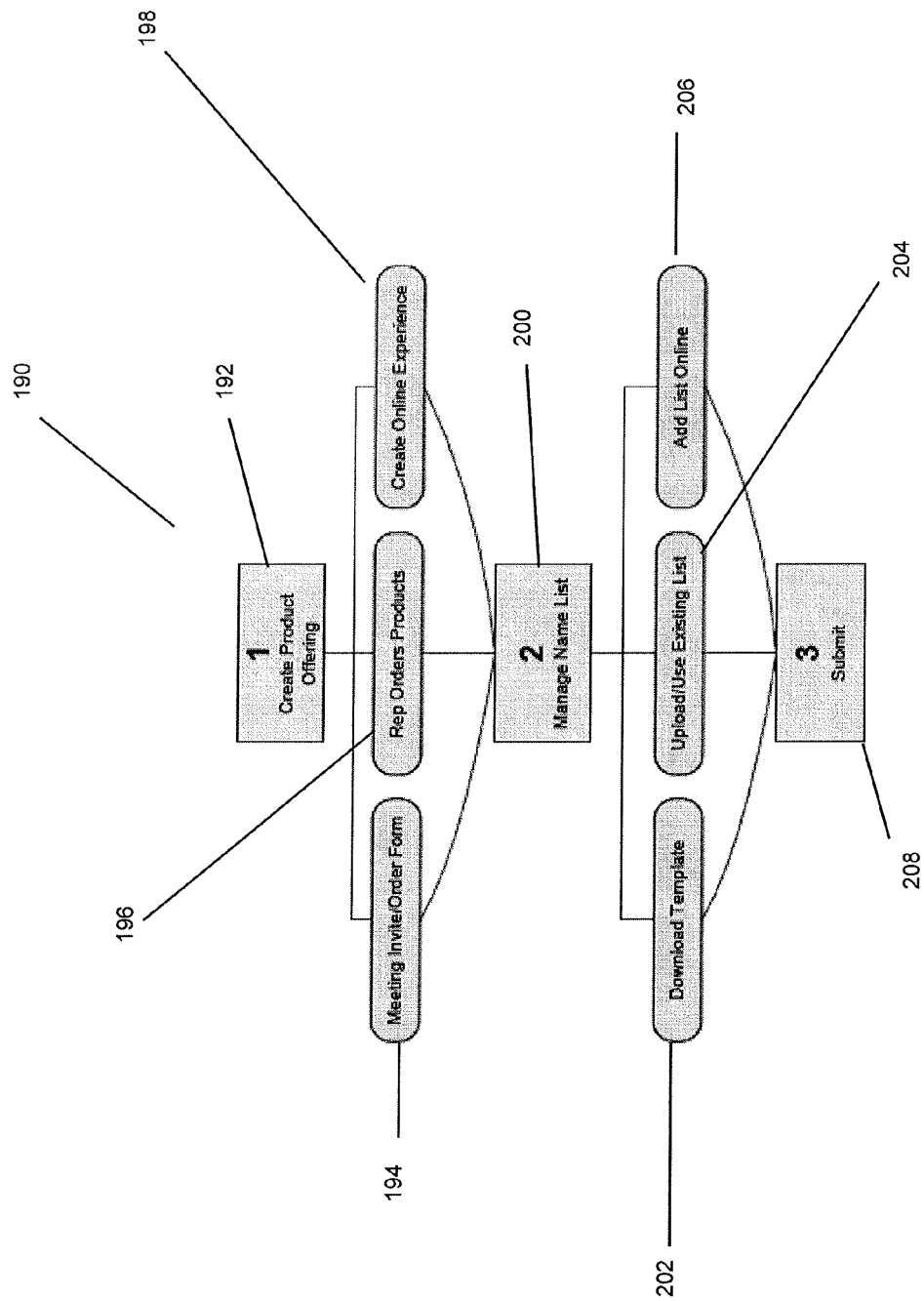
FIG. 26 illustrates a flowchart of a process for generating an order form or invitation to order customized rings in accordance with one embodiment of the present invention.

FIG. 26 illustrates a flowchart 190 of a process for creating an order form, meeting invitation, or online experience to permit ordering of the customized ring, as set forth in box 48 of FIG. 2. At box 192, the user may create a product offering. In this step, the user may select those designed and customized rings which are to be included in the order form or online experience. At box 194, the user may create an order form with or without an invitation to a meeting to discuss ring orders. At box 196, the user may order the customized rings directly. At box 198, the user can create an "online experience," which invites and enables customers to use the ring design system 10 to design and customize their own rings. At box 200, the user may manage a list of the individuals to whom an order form or invitation should be sent. This list can be created by downloading a template list (box 202), uploading and using an existing list (box 204), or adding a list online (box 206). At box 208, the user may submit the order form and invitations by directing the ring design system 10 to send the order forms or invitations to the individuals included on the name list.

Figure 27:
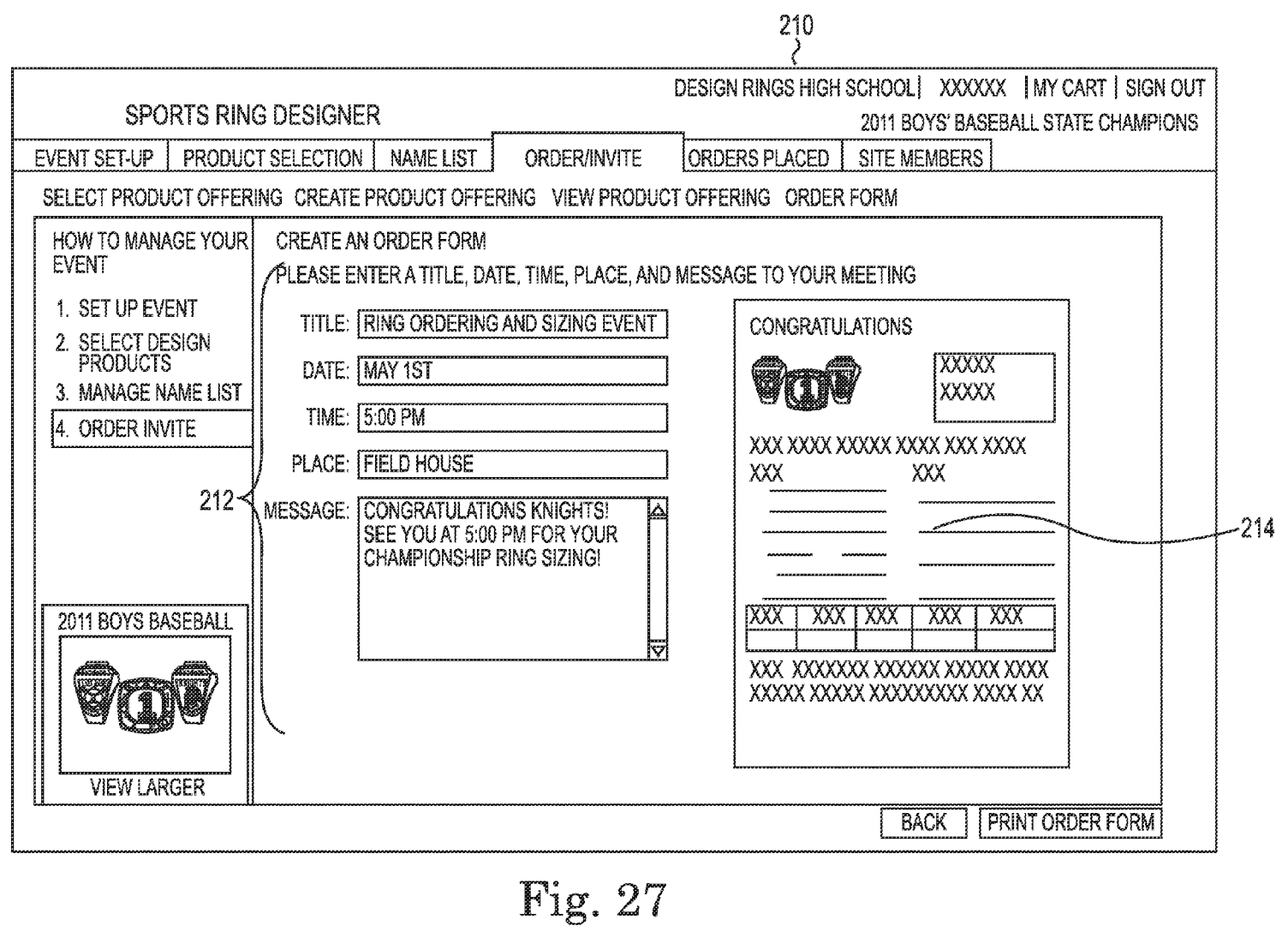

FIG. 27 illustrates an order form creation page 210. The user interface of ring design system 10 provides the user with fillable text boxes 212. The user may incorporate information and text to be included in the completed order form, such as a title, date, time and location for a meeting to discuss ring orders, and a message to include. As depicted in FIG. 27, the order form creation page 210 further displays an image of the order form as modified by the user, incorporating images of the designed ring as well as the text entered by the user.

Figure 28:
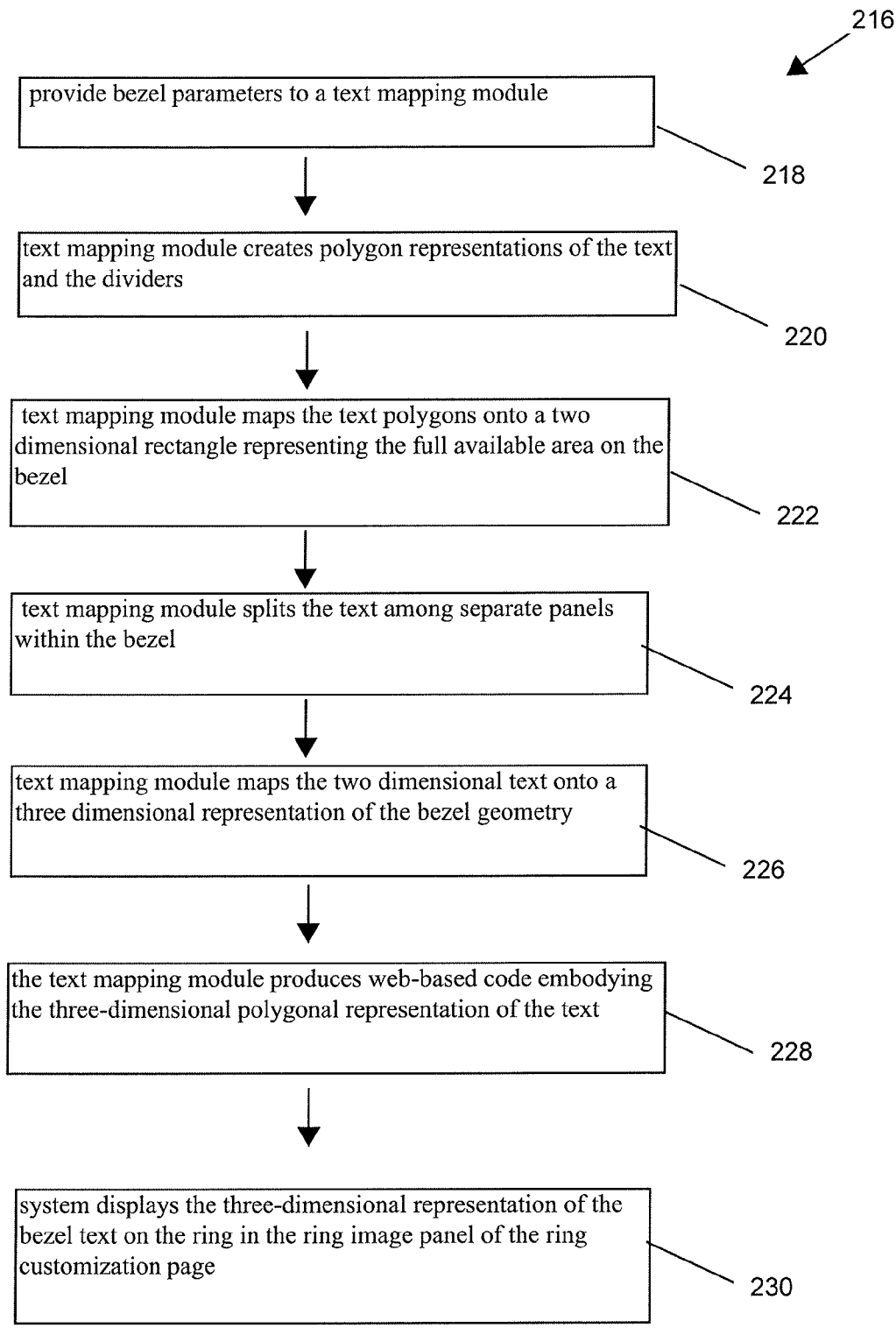
FIG. 28 illustrates a process for receiving, modeling, and displaying bezel customization.

As mentioned above with respect to FIGS. 14B through 14F, a behind the scenes process 216 may be used to dynamically generate a three-dimensional image of customized bezel text and dividers. FIG. 28 shows a flow chart of the steps involved in that process 216. As shown, the system 10, at step 218 may provide bezel parameters to a text mapping module such as a dynamic link library or DLL. The bezel parameters may include, for example, the input received from the personalization menu 115 shown in FIG. 14C including the type of dividers, the number of dividers, the type of customization, and the text of the customization. The text mapping module may create polygon representations of the text and the dividers at step 220. At step 222, the text mapping module may map the text polygons onto a two dimensional rectangle representing the full available area on the bezel. This step may include spacing each polygon along the bezel space to produce equal spacings or to otherwise produce aesthetically pleasing spacings. At step 224, the text mapping module may split the text among separate panels within the bezel. At step 226, the text mapping module may map the two dimensional text onto a three dimensional representation of the bezel geometry. In some embodiments, this involves both curving the text around the center stone to follow the bezel geometry. This curving step may include curving the text to follow a round, oval, square, or other bezel plan shape (i.e., the shape when viewed from above). In addition to curving the text around the center stone, the text may be tipped or slanted to accommodate the slope of the bezel as it slopes away from the top of the center stone. At step 228, the text mapping module may produce web-based code embodying the three-dimensional polygonal representation of the text. For example, the three-dimensional polygonal representation may be transformed into Flash™, Java™, or other web-based code for suitably displaying the image on the Internet, for example. At step 230, the system may display the three-dimensional representation of the bezel text on the ring in the ring image panel of the ring customization page. All of the above steps may be performed dynamically allowing the user to simultaneously view the text they have entered on the ring they are designing and adding to the user's experience and confidence designing his/her ring.

Portions of the process 216 may be the same or similar to the processes described in the following U.S. patent application Ser. No. 11/415,724 entitled Automated Engraving of a Custom Jewelry Item, filed on Sep. 22, 2009, now U.S. Pat. No. 7,593,786; Ser. No. 12/016,881 entitled System and Method for Generating Instructions for Customization, filed on Dec. 21, 2010, now U.S. Pat. No. 7,856,285; Ser. No. 11/109,496 entitled System and Method for Smoothing Three-Dimensional Images, filed on Apr. 19, 2005; and Ser. No. 13/035,742 entitled Method for Digital Manufacturing of Jewelry Items, filed on Feb. 25, 2011. The contents of each of the above listed applications are hereby incorporated by reference herein into the present application. In some embodiments, the method steps reflect quite closely, if not exactly, the same steps used in constructing the models for use in manufacturing the rings. As such, the images shown in the designer may be very similar and sometimes exact three-dimensional rendered models of the ring that user is creating. In particular, for example, the steps 220, 222, and 226 of FIG. 28 may be performed using the same or similar technology to that described in the U.S. application Ser. No. 12/016,881.

Figure 29:
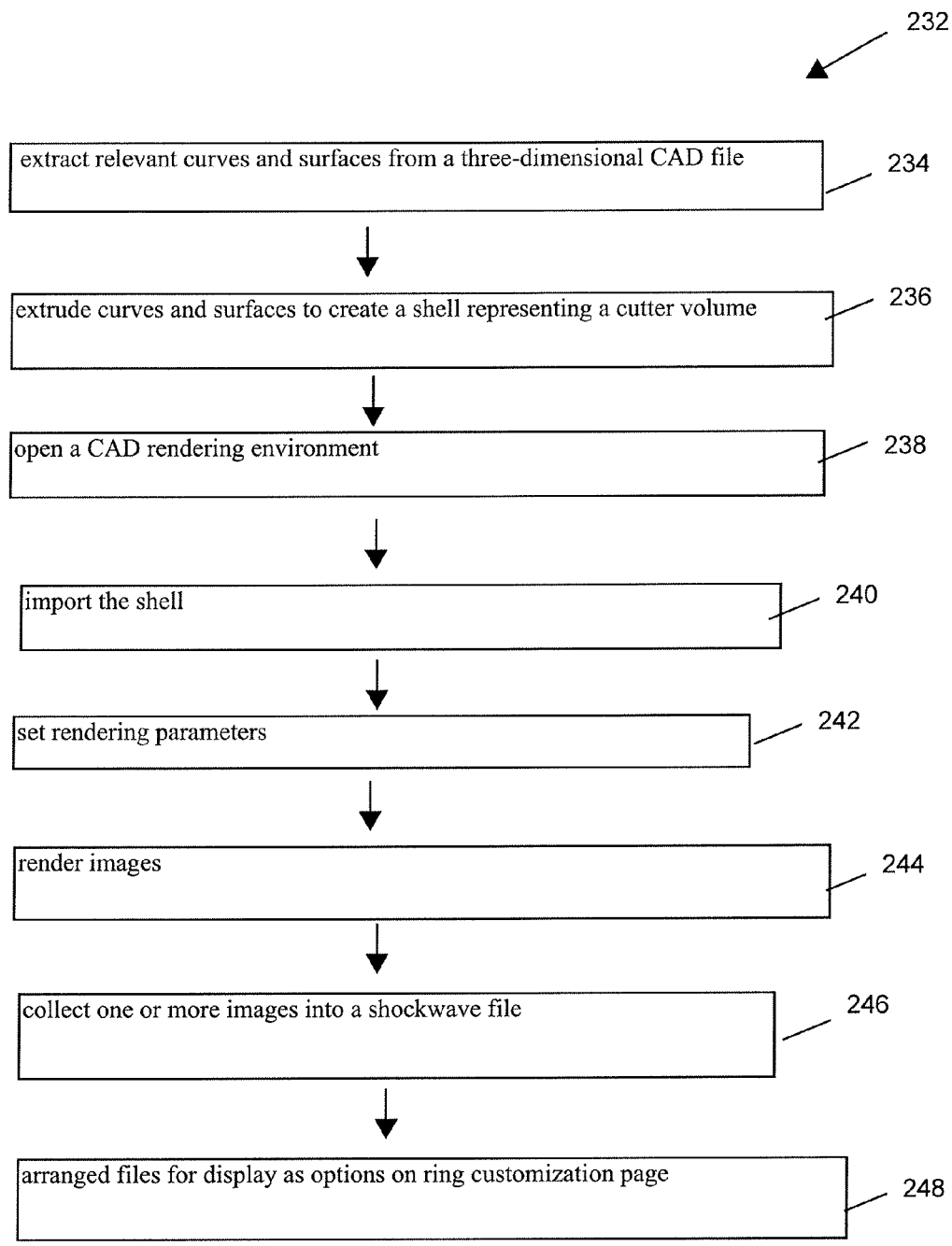
FIG. 29 illustrates a process for converting a CAD file to an image for display by the system.

FIG. 29 shows another behind the scenes process 232 of creating images for the system 10 that exist as computer aided design (CAD) files. This process may be used by the system for several portions of the ring images including side panels, crests, bezels, goldstone, encrusting, and the like. In some embodiments, this process is performed ahead of time and, at the time of ring customization, the images resulting from this process are already available in the designer. Accordingly, this process 232 may be performed by the system 10 or it may be performed by a separate system and the resulting files may be saved in repository such as a computer readable storage medium for access by the system 10. In some cases, for example, where outside custom artwork is requested, the system 10 may run the below described process to produce images in the designer that reflect the requested artwork. In some cases, the user, having requested outside custom artwork may experience a period of delay while a CAD file is created for the requested artwork. However, once the CAD file is created by, for example, a custom artwork representative, the system 10, or a separate system, may generate a corresponding image in the designer for viewing by the user using the process 232. That is, the system 10, or a separate system, may generate the image and save it in a repository for access by the ring designer system 10.

The process 232 may extract relevant curves and surfaces from a three-dimensional CAD file, at operation 234. At operation 236, the system 10 may extrude curves and surfaces to create a shell representing a cutter volume. The cutter volume may include a three-dimensional shell representing the volume that would be removed by a cutter were, for example, a toolpath being created. At operation 238, the system may open a CAD rendering environment and at operation 240, the system may import the shell. At operation 242, the system may set rendering parameters such as the material to be rendered and potentially the light source, the light brightness, and other factors relevant to the appearance of an object. At operation 244, the images may be rendered and at operation 246, the one or more images may be collected into a shockwave file, for example. The images may, thus, be available for the system to arrange 248 and display in, for example, the options panel of the ring customization page 114.

As with process 216, some or all of the operations of the process 232 may be the same or similar to the processes described in the following U.S. patent application Ser. Nos. 11/415,724, 12/016,881, 11/109,496, and 13/035,742 mentioned above. In particular, the operations of process 232 may be performed using, for example, the Boolean type methods and approaches described in the U.S. patent application Ser. No. 13/035,742.

Although the present invention has been described with reference to preferred embodiments, persons skilled in the art will recognize that changes may be made in form and detail without departing from the spirit and scope of the invention.

What is claimed is:

1. A system for designing a customized ring comprising:
   a computing device having computer implemented instructions stored thereon for receiving and storing ring customization input, the instructions comprising:
      a ring style selection component for receiving ring customization input defining the ring style;
      a ring top design component for receiving ring customization input defining the ring top design;
      a ring side design component for receiving ring customization input defining the ring side design;
      an image panel component; and
      an interface supported by the components;
   wherein the components support the interface for monitoring the progress of the ring customization input, the interface having a ring image panel controlled by the image panel component that shows an image of the ring and the image is periodically updated based on the ring customization input to show the customized ring.

2. The system of claim 1, further comprising a metal selection component.

3. The system of claim 1, further comprising an engraving component.

4. The system of claim 1, wherein the ring top design component comprises:
   a stone design component; and
   a bezel text design component.

5. The system of claim 4, wherein the bezel text design component comprises a plurality of bezel text options including a custom option.

6. The system of claim 5, wherein the custom option comprises a layout component configured to receive bezel text input and layout bezel text based on a ring style and the bezel text input.

7. The system of claim 1, wherein the ring side design component comprises a plurality of ring side options for selection by a user, the ring side options comprising a plurality of three-dimensionally modeled depictions of a corresponding plurality of ring side designs.

8. The system of claim 7, further comprising an image creation component for generating the three-dimensionally modeled depictions.

9. The system of claim 1, further comprising manufacturing a ring based on the ring customization input.

10. A system for creating and storing ring assets for use in designing a customized ring, the system comprising:
   a computing device having computer implemented instructions stored thereon for creating ring assets, the instructions comprising:
      an extraction component for extracting relevant data from a computer aided drafting file;
      a rendering component for creating a rendered image based on the data; and
      a storage component for storing the rendered image in a repository for access by a ring customization system.

11. The system of claim 10, wherein the ring assets comprise ring side panel artwork and the data comprises curve data and surface data representing the artwork.

12. The system of claim 10, wherein the ring assets comprise ring crests and the data comprises curve data and surface data representing the crests.

13. The system of claim 10, wherein the ring assets comprise ring bezels and the data comprises curve data and surface data representing the bezels.

14. The system of claim 10, wherein the ring assets comprise outside custom artwork and the data comprises curve data and surface data representing the outside custom artwork.

15. The system of claim 10, further comprising:
a user interface for displaying a plurality of the rendered images;
a selection component for allowing a user to select from the plurality of rendered images; and
an image panel component configured to display an image of the customized ring and dynamically update the image with one of the rendered images when the user selects from the plurality of rendered images.

16. A system for displaying customized bezel text of a customized ring, the system comprising:
a computing device having computer implemented instructions stored thereon for receiving and storing custom bezel text input, the instructions comprising a text mapping module configured for performing a plurality of dynamic operations, the dynamic operations comprising:
receiving bezel parameters;
mapping the text in a two dimensional space;
mapping the text in a three-dimensional space defined by bezel geometry;
transforming the three-dimensionally mapped text into code for displaying the text on a screen; and
displaying the text on a screen.

17. The system of claim 16, wherein the system further comprises an interface for monitoring the progress of the customized ring and the interface includes a ring image panel and displaying the text comprises displaying the text on the ring image panel.

18. The system of claim 16, wherein the operations further comprise creating polygon representations of the text.

19. The system of claim 16, wherein the operations further comprise creating polygon representations of dividers.

20. The system of claim 16, wherein the operations further comprise splitting the text between separate panels of a bezel.

* * * * *